United States Patent
Chen

(10) Patent No.: US 9,730,362 B2
(45) Date of Patent: Aug. 8, 2017

(54) HEATER EXCHANGER

(71) Applicants: EZCONN CORPORATION, Taipei (TW); Smart Energy, Inc., Tainan (TW)

(72) Inventor: Shih-Hsiung Chen, Tainan (TW)

(73) Assignees: EZCONN CORPORATION, Taipei (TW); SMART ENERGY, INC., Tainan (TW)

( * ) Notice: Subject to any disclaimer, the term of this patent is extended or adjusted under 35 U.S.C. 154(b) by 0 days.

(21) Appl. No.: 14/973,749

(22) Filed: Dec. 18, 2015

(65) Prior Publication Data

US 2016/0183398 A1 Jun. 23, 2016

(30) Foreign Application Priority Data

Dec. 18, 2014 (CN) ..................... 2014 2 0811063 U

(51) Int. Cl.
*H05K 7/20* (2006.01)

(52) U.S. Cl.
CPC ..... *H05K 7/20409* (2013.01); *H05K 7/20336* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2003/0151895 A1* | 8/2003 | Zuo | ......................... | F28F 13/10 361/699 |
| 2004/0035558 A1* | 2/2004 | Todd | ................... | F28D 15/0275 165/104.26 |
| 2004/0037036 A1* | 2/2004 | Suzuki | .................. | H01L 23/367 361/688 |
| 2004/0188064 A1* | 9/2004 | Upadhya | ................. | F04B 17/00 165/80.3 |

(Continued)

*Primary Examiner* — Anthony Haughton
*Assistant Examiner* — Razmeen Gafur
(74) *Attorney, Agent, or Firm* — Min-Lee Teng; Litron Patent & Trademark Office

(57) ABSTRACT

A heat exchanger is configured to be arranged on a first housing of an electronic device, wherein the first housing has a top surface and a sidewall neighboring on the top surface, wherein the first housing has multiple first metal sheets protruding from the sidewall of the first housing. The heat exchanger includes a second housing configured to be mounted to the first housing, wherein a first opening is at a bottom of the second housing and configured to have the electronic device extend into an inner space in the second housing through the first opening, and a second opening is at a wall of the second housing and communicates with the inner space. The heat exchanger includes multiple second metal sheets in the inner space, wherein the second metal sheets are configured to be arranged over the top surface of the first housing, and a first heater in the inner space and thermally connected to the second metal sheets.

20 Claims, 18 Drawing Sheets

(56) References Cited

U.S. PATENT DOCUMENTS

| | | | | |
|---|---|---|---|---|
| 2005/0133212 A1* | 6/2005 | Wilson | F28D 15/0266 | 165/168 |
| 2006/0089042 A1* | 4/2006 | Lawton | H05K 7/20336 | 439/485 |
| 2007/0064396 A1* | 3/2007 | Oman | H01L 23/427 | 361/700 |
| 2007/0095507 A1* | 5/2007 | Henderson | F28D 15/043 | 165/104.26 |
| 2007/0177348 A1* | 8/2007 | Kehret | H05K 7/1434 | 361/690 |
| 2007/0242438 A1* | 10/2007 | Belits | F28D 15/0266 | 361/700 |
| 2008/0055845 A1* | 3/2008 | Murakami | H05K 7/20754 | 361/679.48 |
| 2008/0164010 A1* | 7/2008 | Kang | F28D 15/0266 | 165/104.26 |
| 2008/0169089 A1* | 7/2008 | Wu | H01L 23/427 | 165/104.33 |
| 2008/0196868 A1* | 8/2008 | Attlesey | G06F 1/181 | 165/104.33 |
| 2009/0219679 A1* | 9/2009 | Moore | G06F 1/20 | 361/679.31 |
| 2009/0225513 A1* | 9/2009 | Correa | H05K 7/20781 | 361/700 |
| 2010/0097767 A1* | 4/2010 | Jude | H05K 7/20409 | 361/709 |
| 2012/0160454 A1* | 6/2012 | Zhang | F28D 15/0266 | 165/104.26 |
| 2012/0218711 A1* | 8/2012 | Kashirajima | F25B 25/00 | 361/700 |
| 2013/0118713 A1* | 5/2013 | Hwang | F28F 3/02 | 165/104.19 |
| 2013/0128455 A1* | 5/2013 | Koblenz | G05D 23/1917 | 361/692 |
| 2013/0188310 A1* | 7/2013 | Noteboom | H05K 7/20745 | 361/679.48 |
| 2013/0213075 A1* | 8/2013 | Bilski | H05K 7/20245 | 62/259.2 |
| 2013/0322024 A1* | 12/2013 | Tantolin | H05K 7/20672 | 361/721 |
| 2014/0268570 A1* | 9/2014 | Crouch | H05K 7/20936 | 361/696 |

* cited by examiner

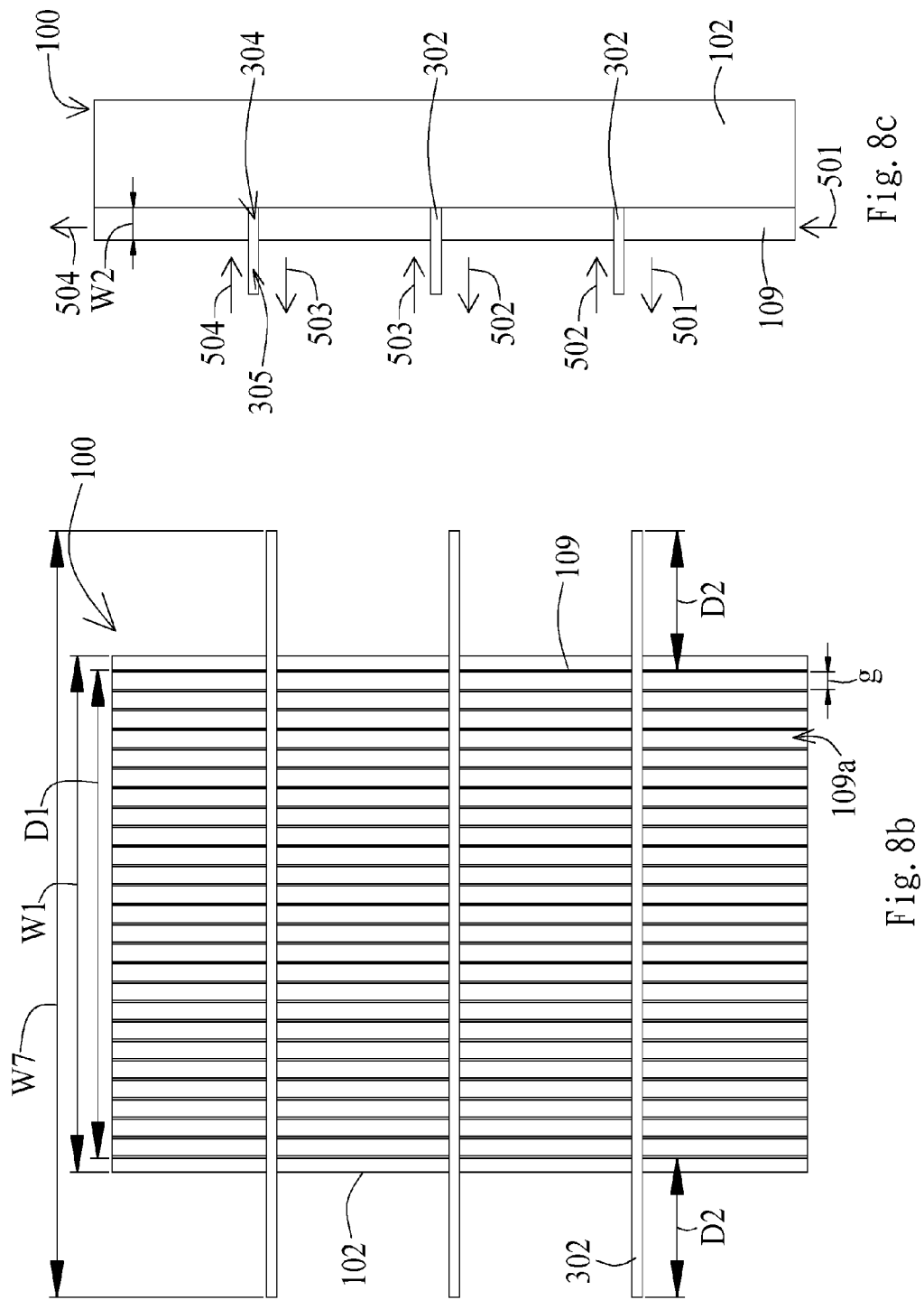

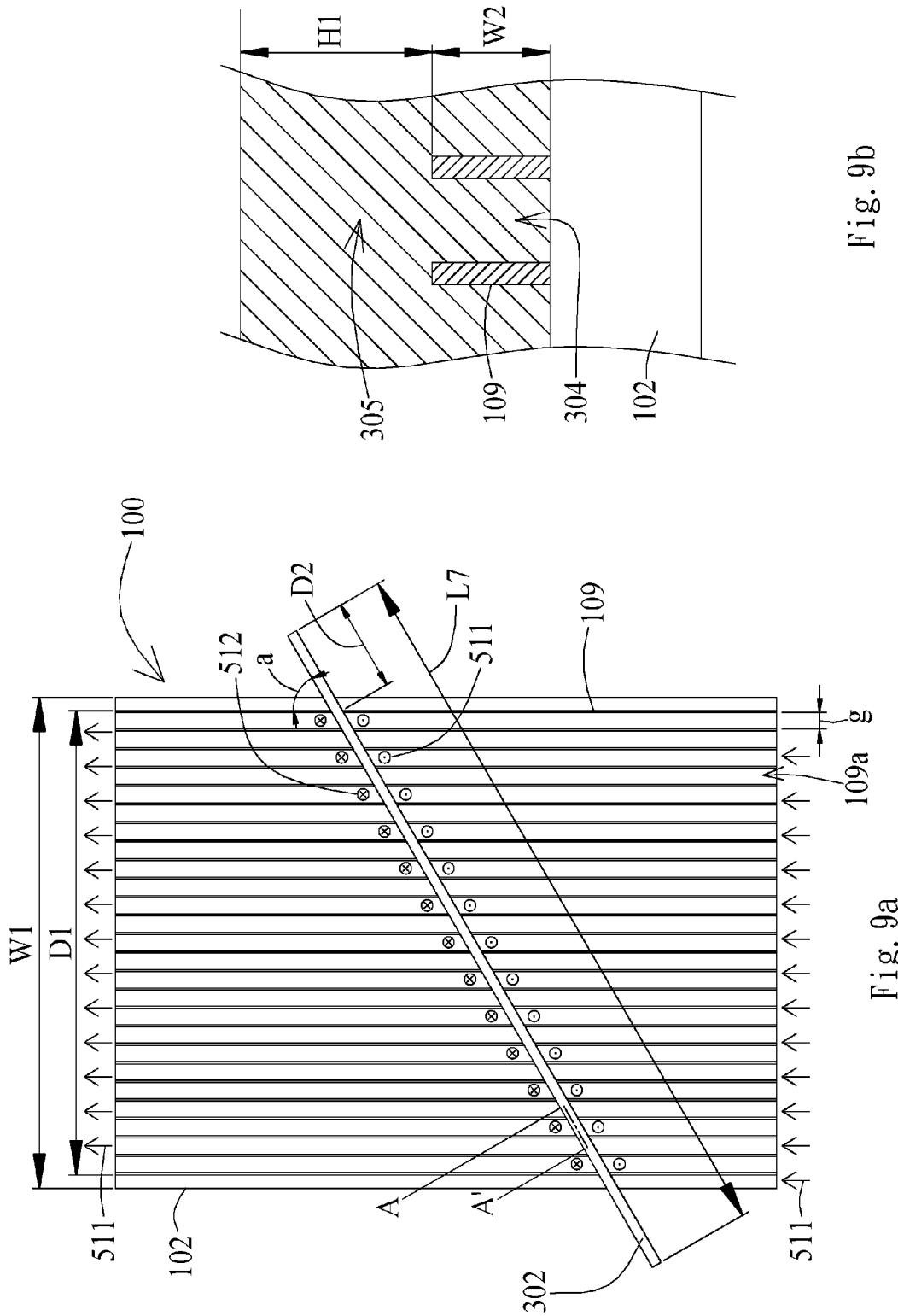

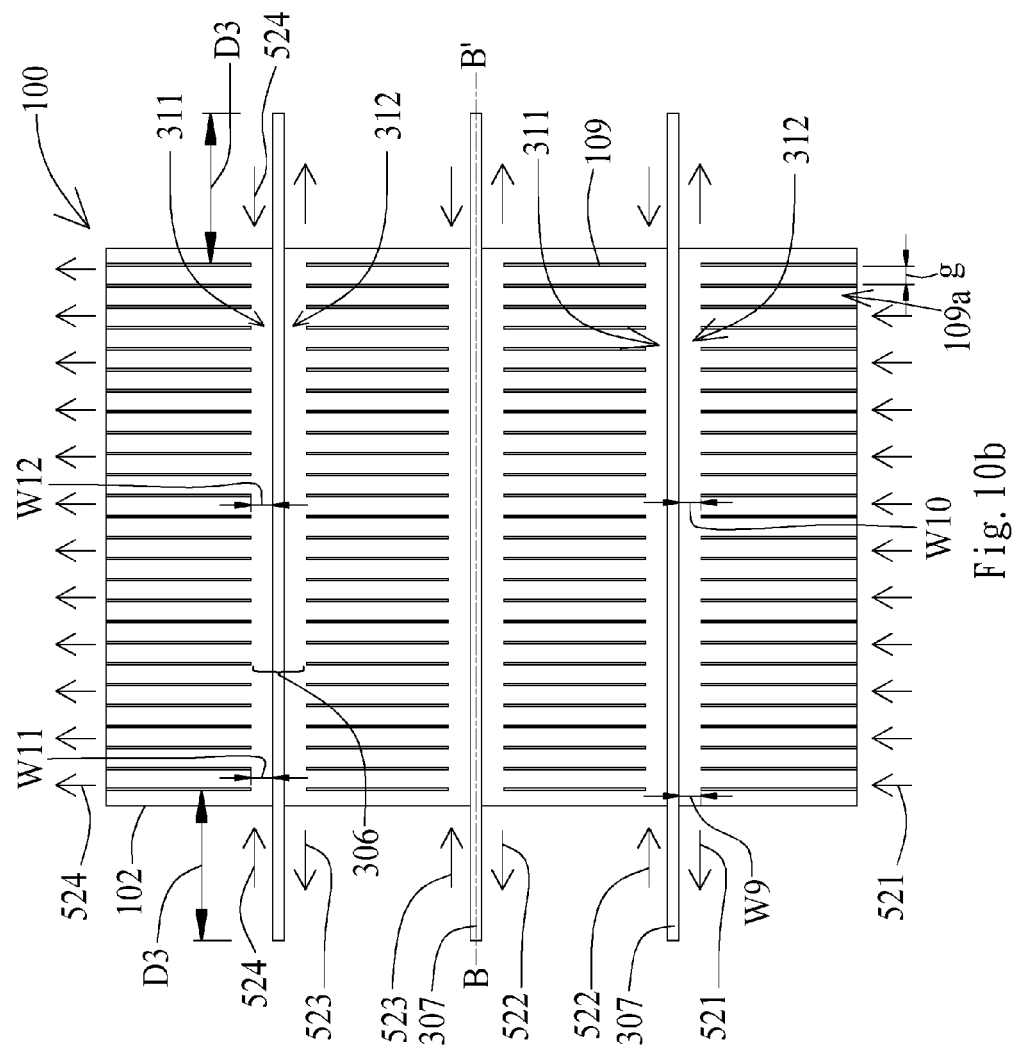

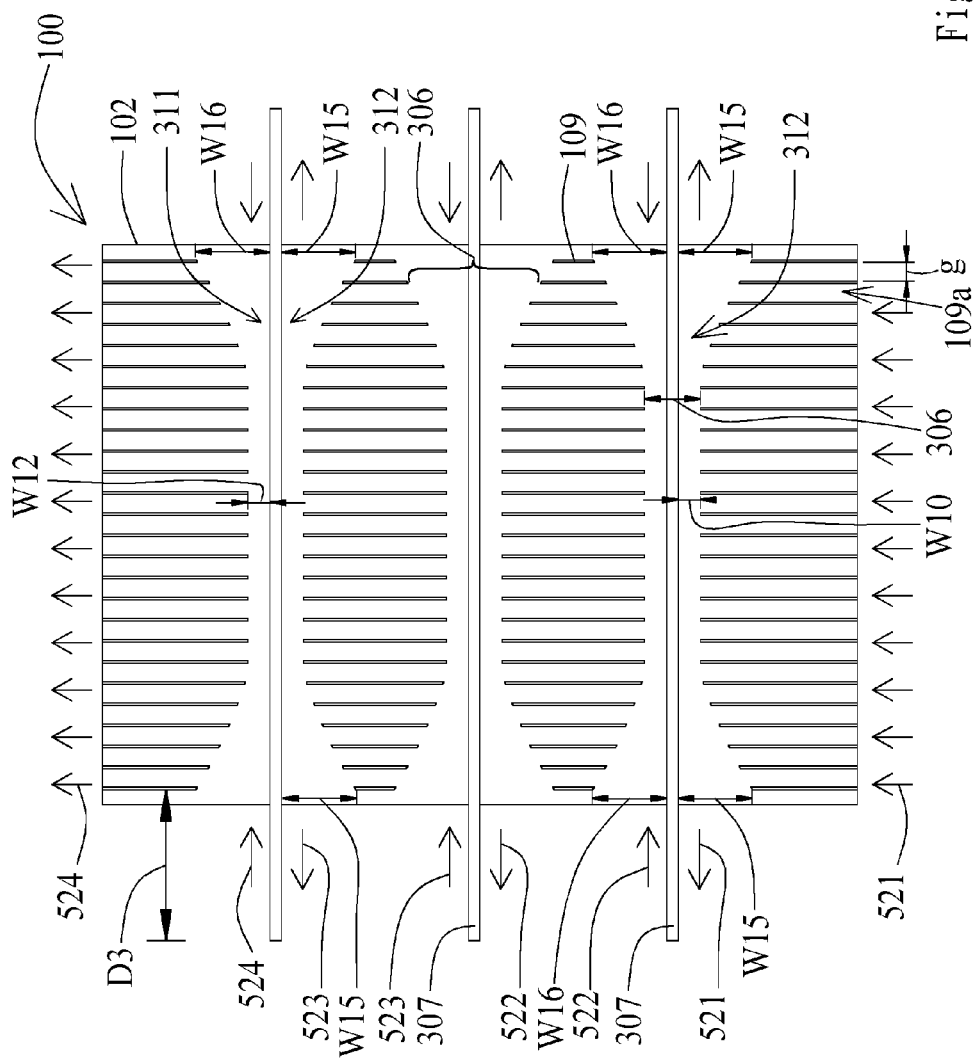

HEATER EXCHANGER

BACKGROUND OF THE DISCLOSURE

This patent application claims priority of China Patent Application No. 201420811063.0, filed on Feb. 18, 2014, the entirety of which is incorporated herein by reference.

Field of the Disclosure

The present disclosure relates to a heat exchanger, and more particularly to a heat exchanger designed based on an effect of buoyancy on heat transfer.

Brief Description of the Related Art

A radio remote unit (RRU) is used to perform conversion between a wireless radio-frequency signal and a digital signal. In order to reduce the loss due to the transmission of a radio-frequency signal, the radio remote unit is typically arranged at the periphery of an antenna, such as at a signal transmitting tower or at a top of a building. Excessive heat may be generated when the radio remote unit performs conversion for a large number of signals. If the excessive heat is not immediately dissipated, the accumulated heat will lead the radio remote unit to be broken down. Traditionally, the excessive heat is dissipated via multiple metal fins on a housing of the radio remote unit (RRU), but the efficiency of heat dissipation is extremely limited.

SUMMARY OF THE DISCLOSURE

The present disclosure provides a heat exchanger over a housing of an electronic device so as to create an effect of buoyancy on heat transfer between the heat exchanger and the electronic device. Thereby, cold air may be continuously introduced from the outside to efficiently dissipate heat generated by the electronic device.

The present disclosure provides a heat exchanger configured to be arranged on a first housing of an electronic device, wherein the first housing has a top surface and a sidewall neighboring on the top surface, wherein the first housing has multiple first metal sheets protruding from the sidewall of the first housing. The heat exchanger includes a second housing configured to be mounted to the first housing, wherein a first opening is at a bottom of the second housing and configured to have the electronic device extend into an inner space in the second housing through the first opening, and a second opening is at a wall of the second housing and communicates with the inner space. The heat exchanger includes multiple second metal sheets in the inner space, wherein the second metal sheets are configured to be arranged over the top surface of the first housing. The heat exchanger includes a first heater in the inner space and thermally connected to the second metal sheets.

The present disclosure provides a heat exchanger configured to be arranged on a first housing of an electronic device, wherein the first housing has a top surface and a sidewall neighboring on the top surface, wherein the first housing has multiple first metal sheets protruding from the sidewall of the first housing. The heat exchanger includes a second housing configured to be mounted to the first housing, wherein a first opening is at a bottom of the second housing and configured to have the electronic device extend into an inner space in the second housing through the first opening, and a second opening is at a wall of the second housing and communicates with the inner space. The heat exchanger includes multiple second metal sheets in the inner space, wherein the second metal sheets are configured to be arranged over the top surface of the first housing. The heat exchanger includes a first heat-conductive pipe in the inner space, wherein the first heat-conductive pipe is thermally connected to the second metal sheets and configured to be thermally connected to the sidewall of the first housing.

The present disclosure provides an electronic device comprising: a first housing; multiple metal sheets protruding from a front surface of the first housing by a width of the metal sheets, wherein the metal sheets are arranged in parallel side by side, wherein the metal sheets and first housing are formed as a single part; and a first current-guided plate having a first insertion portion in a gap between two of the metal sheets and a first longitudinal portion joining the first insertion portion and extending across the metal sheets.

The present disclosure provides an electronic device comprising: a first housing; multiple metal sheets protruding from a front surface of said first housing by a width of said metal sheets, wherein said metal sheets are arranged in parallel side by side, wherein multiple first cuts in said metal sheets are aligned in a direction; and a first current-guided plate extending on said front surface of said first housing and through said first cuts.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 8b is a front view illustrating the radio remote unit provided with the current-guide plates in accordance with the sixth embodiment of the present invention.

FIG. 8c is a side view illustrating multiple currents guided by the current-guide plates in accordance with the sixth embodiment of the present invention.

FIG. 9a is a front view illustrating the radio remote unit provided with a current-guide plate in accordance with a seventh embodiment of the present invention.

FIG. 9b is an enlarged cross-sectional view along a line A-A' illustrating the current-guide plate assembled with the metal sheets in accordance with the seventh embodiment of the present invention.

FIG. 10b is a front view illustrating one of the stacked radio remote units assembled with multiple current-guide plates in accordance with the eighth embodiment of the present invention.

FIG. 10e is a front view illustrating one of the stacked radio remote units assembled with multiple current-guide plates in accordance with a tenth embodiment of the present invention.

Figure 1:
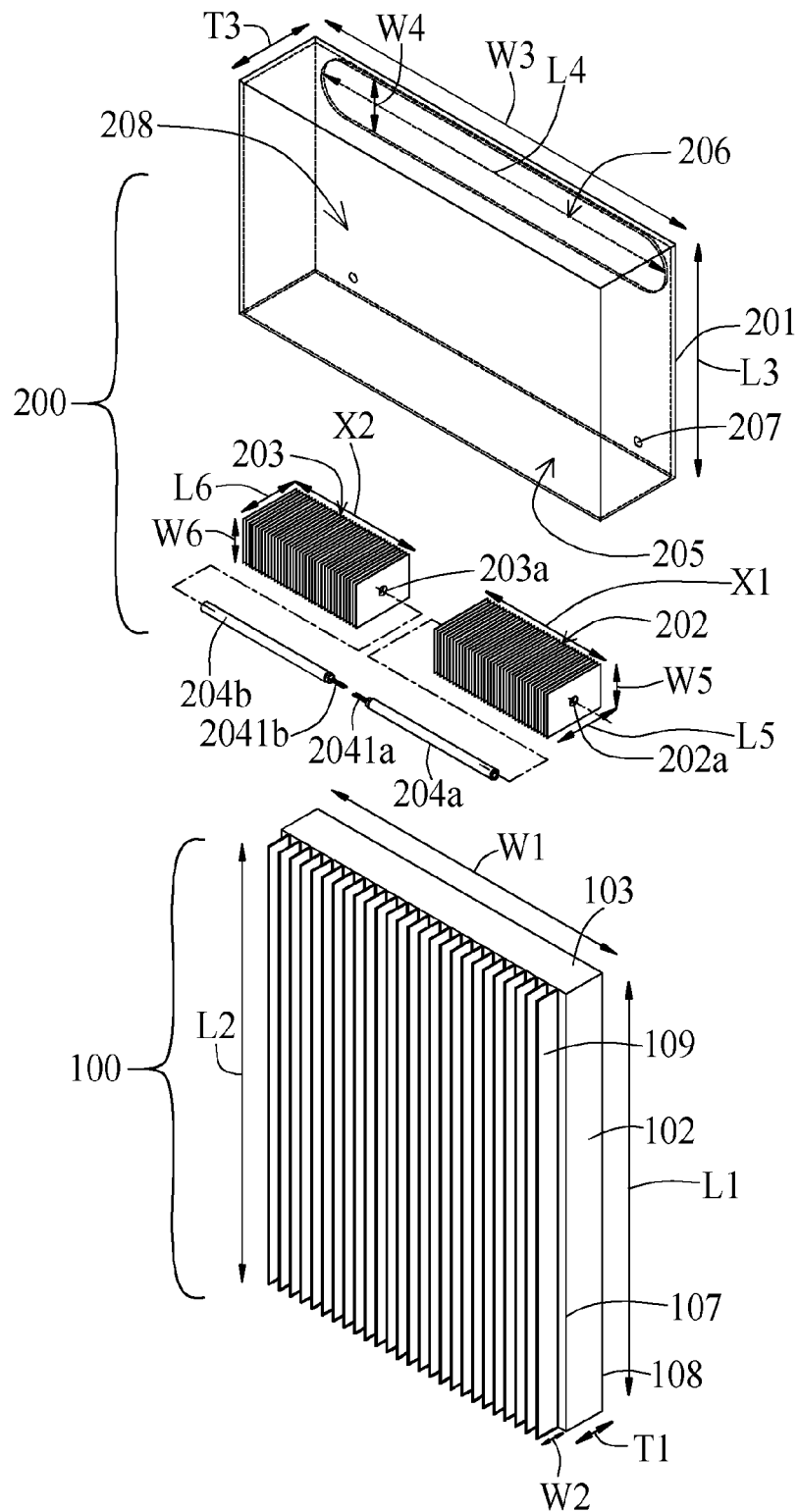
FIG. 1 is a schematically exploded view illustrating an assembly for a radio remote unit and a heat exchanger in three dimensions in accordance with a first embodiment of the present invention.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed. When the same reference number or reference indicator appears in different drawings, it may refer to the same or like components or steps.

In accordance with the present disclosure, a heat exchanger is provided to be mounted on a housing of an electronic device for generating an effect of buoyancy on heat transfer between the heat exchanger and the electronic device. Thereby, cold air may be continuously introduced from the outside to efficiently dissipate heat generated by the electronic device.

First Embodiment

Figure 2:
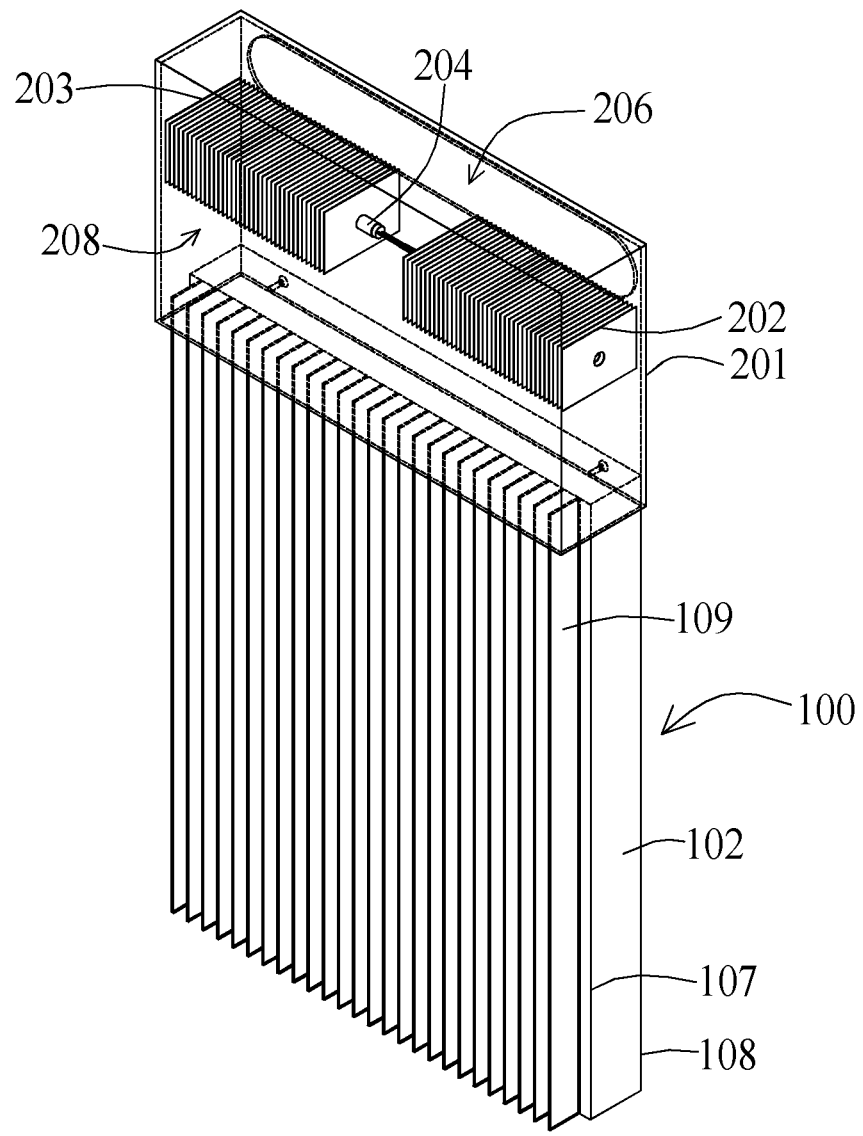
FIG. 2 is a perspective view illustrating the assembly for the radio remote unit and the heat exchanger in three dimensions in accordance with the first embodiment of the present invention.

FIGS. 1 and 2 are views illustrating a heat exchanger in according with a first embodiment of the present invention. Referring to FIGS. 1 and 2, the heat exchanger may be mounted on an electronic device 100, which may include communication equipment, a signal switch device or a power amplifier. In an embodiment, the electronic device 100 may be a radio remote unit (RRU) that may perform conversion between a radio-frequency signal and a digital signal. The radio-frequency signal may be a signal for a global system for mobile communication (GSM), a signal for code division multiple access (CDMA), a signal for time-division synchronous CDMA (TD-SCDMA), a signal for a wideband code-division multiple access (W-CDMA), a signal for long-term evolution (LTE), a signal for long-term evolution frequency-division duplex (LTE FDD) or a signal for long-term evolution time-division duplex (LTE TDD). The electronic device 100 includes a first housing 102 having a rectangular shape, for example. Multiple sets of transceivers, one or more sets of power amplifier, one or multiple sets of diplexer and a backup battery are arranged within the first housing 102. The first housing 102 has a top surface 103, a front side wall 107 and a back side wall 108 parallel to the front side wall 107. The first housing 102 includes multiple metal sheets 109 for heat dissipation or conduction vertically protruding from the front side wall 107, wherein the metal sheets 109 are arranged in parallel with one another. The metal sheets 109 may be made of aluminum, an aluminum alloy, copper, a copper alloy, nickel, silver, steel, graphite, a thermally conductive metal or material, or a combination thereof. The first housing 102 may have a thickness T1, i.e. a distance between the front surface 107 and the back surface 108, between 40 mm and 300 mm, such as between 40 mm and 150 mm, between 140 mm and 200 mm or between 170 mm and 300 mm, a length L1 between 200 mm and 700 mm, such as between 200 mm and 500 mm or between 300 mm and 700 mm, and a width W1 between 150 mm and 500 mm, such as between 150 mm and 300 mm or between 200 mm and 500 mm. Each of the metal sheets 109 has a thickness between 5 mm and 80 mm, such as between 5 mm and 30 mm, between 10 and 50 mm or between 20 and 80 mm, a length L2 between 200 mm and 600 mm, such as between 200 mm and 400 mm or between 250 mm and 600 mm, and a width W2 between 150 mm and 500 mm, such as between 150 mm and 300 mm or between 200 mm and 500 mm.

Referring to FIGS. 1 and 2, a heat exchanger 200 may be provided to be mounted to the electronic device 100. The heat exchanger 200 may include a second housing 201, a first set of metal sheets 202 for heat dissipation or conduction, a second set of metal sheets 203 for heat dissipation or conduction, two heaters 204a and 204b, one or more temperature sensors (not shown) and a control circuit (not shown). An opening 205 at a bottom of the second housing 201 and an opening 206 at a back side wall of the second housing 201 and close to a top side wall of the second housing 201 communicate with an inner space 208 in the second housing 201. The second housing 201 has a thickness T3 between 50 mm and 310 mm, such as between 50 mm and 160 mm, between 150 mm and 210 mm or between 180 and 310 mm, a length L3 between 150 mm and 300 mm, such as between 150 and 250 mm or between 170 and 300 mm, and a width W3 between 150 mm and 500 mm, such as between 150 mm and 300 mm or between 200 mm and 500 mm. The opening 206 has a width W4 between 20 mm and 70 mm, such as between 20 mm and 50 mm or between 30 mm and 70 mm, and a length L4 between 150 mm and 500 mm, such as between 150 mm and 300 mm or between 200 mm and 500 mm. The second housing 201 may be mounted to the back side wall 108 of the first housing 102 by multiple screws (not shown) screwed through multiple holes 207 at the back side wall of the second housing 201 to the back side wall 108 of the first housing 102. The opening 205 has the electronic device 100 extend into the inner space 208 in the second housing 201 therethrough. Thus, the first housing 102 has a top portion arranged in the inner space 208 in the second housing 201 and each of the metal sheets 109 has a top portion arranged in the inner space 208 in the second housing 201. An insertion depth, in which the first housing 102 or each of the metal sheets 109 is inserted into the second housing 201, may be between 10 mm and 80 mm, such as between 10 mm and 40 mm or between 30 and 80 mm. The second housing 201 may be made of a plastic material, such as polypropylene, polystyrene, polycarbonate, melamine resin or polytetrafluoroethene, or a metal material, such as copper, iron, steel or aluminum. Alternatively, a heat-absorbing coating, such as black coating made of carbon black, may be coated on the second housing 201.

The first set of metal sheets 202 and the second set of metal sheets 203 may be fixed in the inner space 208 in the second housing 201 by means of screwing, engaging, locking, joining or adhering connections. The first and second sets of metal sheets 202 and 203 are fixed, in the gravity coordinate, over the top surface 203 of the first housing 102. The metal sheets 202 in the first set are stacked with one another and with a gap between neighboring two of the metal sheets 202. The metal sheets 203 in the second set are stacked with one another and with a gap between neighboring two of the metal sheets 203. Each of the metal sheets 202 and 203 in the first and second sets may be made of aluminum, an aluminum alloy, copper, a copper alloy, nickel, silver, steel, graphite, a thermally conductive metal or material, or a combination thereof. Each of the metal sheets 202 in the first set may have a thickness between 0.2 mm and 1.2 mm, such as between 0.2 mm and 0.8 mm or between 0.3 mm and 1.2 mm, a length L5 between 80 mm and 180 mm, such as between 80 mm and 130 mm or between 100 mm and 180 mm, and a width W5 between 50 mm and 120 mm, such as between 50 mm and 80 mm or between 60 mm and 120 mm. The metal sheets 202 in the first set are stacked with one another in a direction parallel to the width W1 of the first housing 102 to an extent X1 between 20 mm and 70 mm, such as between 20 mm and 50 mm or between 30 mm and 70 mm, and with a gap between neighboring two of the metal sheets 202. Also, each of the metal sheets 203 in the second set may have a thickness between 0.2 mm and 1.2 mm, such as between 0.2 mm and 0.8 mm or between 0.3 mm and 1.2 mm, a length L6 between 80 mm and 180 mm, such as between 80 mm and 130 mm or between 100 mm and 180 mm, and a width W5 between 50 mm and 120 mm, such as between 50 mm and 80 mm or between 60 mm and 120 mm. The metal sheets 203 in the second set are stacked with one another in a direction parallel to the width W1 of the first housing 102 to an extent X2 between 20 mm and 70 mm, such as between 20 mm and 50 mm or between 30 mm and 70 mm, and with a gap between neighboring two of the metal sheets 203. Multiple holes 202a passing through the metal sheets 202 in the first set at centers thereof may be aligned in a line and may have a diameter between 5 mm and 20 mm, such as between 5 mm and 9 mm or between 8 mm and 20 mm. Multiple holes 203a passing through the metal sheets 203 in the second set at centers thereof may be aligned in a line and may have a diameter between 5 mm and 20 mm, such as between 5 mm and 9 mm or between 8 mm and 20 mm.

The heater 204a may pass through the holes 202a in the metal sheets 202 in the first set, and the heater 204b may pass through the holes 203a in the metal sheets 203 in the second set. Each of the heaters 204a and 204b may be a tube heater, flat heater, Flange electric heating tube, spiral heater, multi-tube type of heater. In this embodiment, each of the heaters 204a and 204b is a tube heater having a diameter between 5 mm and 20 mm, such as between 5 mm and 9 mm or between 8 mm and 20 mm. The heater 204a has an electrical terminal 2041a projecting from a set of the aligned holes 202a for connecting with a control circuit arranged in the first housing 102. Alternatively, the control circuit may be arranged in the second housing 201 and outside the first housing 102. The heater 204b has an electrical terminal 2041b projecting from a set of the aligned holes 203a for connecting with the control circuit. Each of the heaters 204a and 204b may be powered by an alternate current (AC) or a direct current (DC). The control circuit may be connected to one or more temperature sensors configured to sense one or more temperatures at one or various positions, such as at the top surface 103, front side wall 107 or back side wall 108 of the first housing 102, at a bottom surface of the first housing 102, at left or right side wall of the first housing 102, at a specific or critical position, e.g. a surface of an electronic element, in the first housing 102 or at the combination thereof. The control circuit may be configured to control the heaters 204a and 204b to heat the first and second sets of metal sheets 202 and 203 respectively based on the temperature(s) sensed by the one or more temperature sensors. Each of the temperature sensors may be a thermocouple, resistance or thermistor temperature-sensor, for example.

In this embodiment, heat generated by the electronic device 100 may be transmitted to the position(s), having the one or more temperature sensors mounted thereon, with temperature to be sensed by the one or more temperature sensors. Information related to the sensed temperature(s) may be transmitted to the control circuit. Upon determining one or more of the sensed temperature(s) is higher than a threshold temperature between 30 and 60 Celsius degrees, such as 40, 45 or 50 Celsius degrees, the control circuit may control the heaters 204a and 204b to heat the first and second sets of metal sheets 202 and 203 respectively such that the first and second sets of metal sheets 202 and 203 may have increased temperature. Each of the heaters 204a and 204b may have a temperature controlled to be greater than one or more of the sensed temperature by between 3 and 70 Celsius degrees, such as between 3 and 15 Celsius degrees, between 10 and 35 Celsius degrees or between 20 and 70 Celsius degrees. When the first and second sets of metal sheets 202 and 203 have increased temperature, the temperature within the inner space 208 in the second housing 201 may be increased to create an effect of buoyancy on heat transfer, that is, an air current may flow from the front side wall 107 of the first housing 102 upward, in the gravity coordinate, into the inner space 208 in the second housing 201 and then to the outside of the second housing 201 through the opening 206. Thereby, an air current flowing through each gap between neighboring two of the metal sheets 109 may be increased to improve heat dissipation from the metal sheets 109.

Second Embodiment

Figure 3:
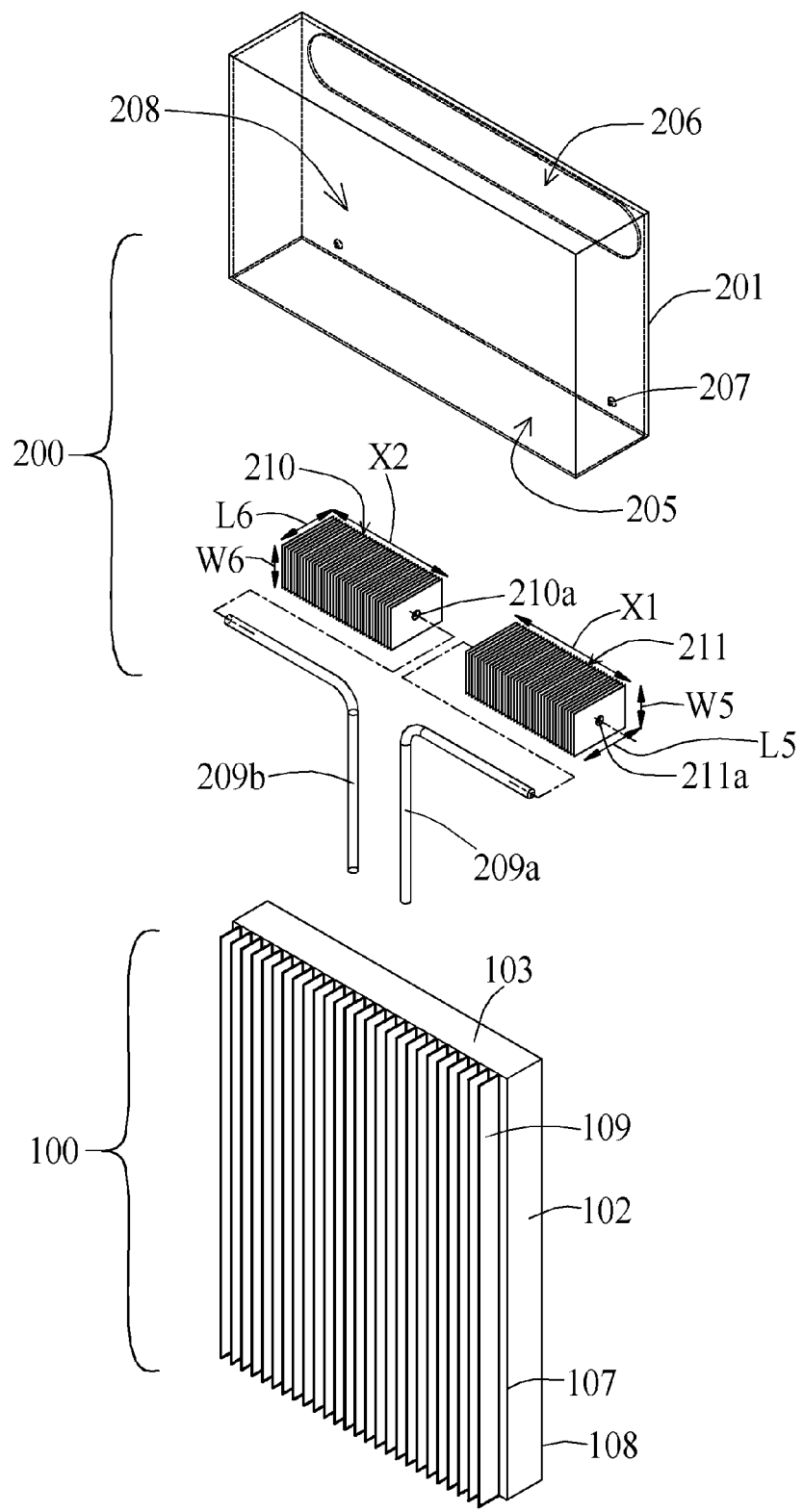
FIG. 3 is a schematically exploded view illustrating an assembly for a radio remote unit and a heat exchanger in three dimensions in accordance with a second embodiment of the present invention.
Figure 4:
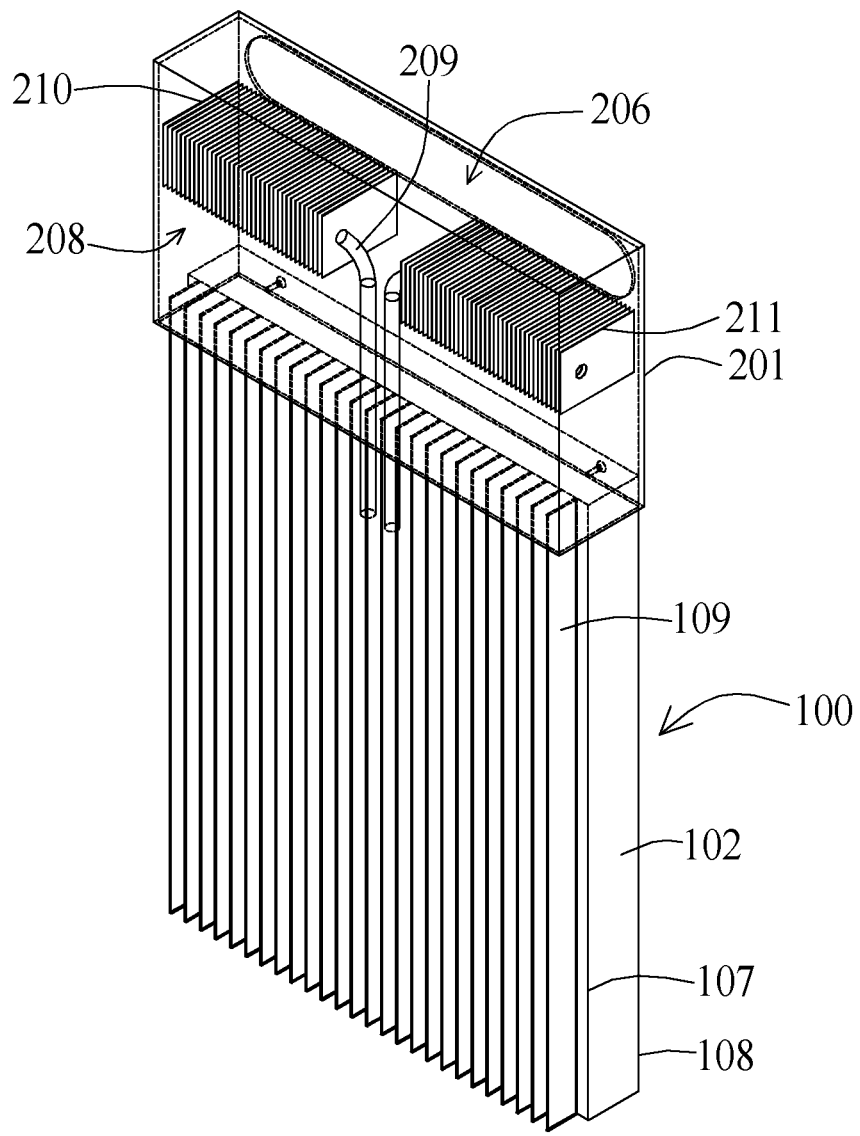
FIG. 4 is a perspective view illustrating the assembly for the radio remote unit and the heat exchanger in three dimensions in accordance with the second embodiment of the present invention.

FIGS. 3 and 4 are views illustrating a heat exchanger in according with a second embodiment of the present invention. Referring to FIGS. 3 and 4, the difference between the first and second embodiments is that a L-shaped heat-conductive pipe 209a may be provided to thermally connect a third set of metal sheets 211 to the first housing 102 such that heat generated by the electronic device 100 may be immediately transmitted to the third set of metal sheets 211 through the first housing 102 and L-shaped heat-conductive pipe 209a and thus the third set of metal sheets 211 may have increased temperature. Further, a L-shaped heat-conductive pipe 209b may be provided to thermally connect a fourth set of metal sheets 210 to the first housing 102 such that heat generated by the electronic device 100 may be immediately transmitted to the fourth set of metal sheets 210 through the first housing 102 and L-shaped heat-conductive pipe 209b and thus the fourth set of metal sheets 210 may have increased temperature. Accordingly, when the third and fourth sets of metal sheets 211 and 210 have increased temperature, the temperature within the inner space 208 in the second housing 201 may be increased to create an effect of buoyancy on heat transfer, that is, an air current may flow from the front side wall 107 of the first housing 102 upwards, in the gravity coordinate, into the inner space 208 in the second housing 201 and then to the outside of the second housing 201 through the opening 206. Thereby, air current flowing through each gap between neighboring two of the metal sheets 109 may be increased to improve heat dissipation from the metal sheets 109.

Referring to FIGS. 3 and 4, the third set of metal sheets 211 as illustrated in this embodiment may have the dimensions and materials as referred to those of the first set of metal sheets 202 as illustrated in the first embodiment. The fourth set of metal sheets 211 as illustrated in this embodiment may have the dimensions and materials as referred to those of the second set of metal sheets 203 as illustrated in the first embodiment. Multiple holes 211a passing through the metal sheets 211 in the third set may be aligned in a line and the L-shaped heat-conductive pipe 209a may have a horizontal section, substantially parallel to the top surface 103 of the first housing 102, passing through the holes 211a in the metal sheets 211 in the third set. Multiple holes 210a passing through the metal sheets 210 in the fourth set may be aligned in a line and the L-shaped heat-conductive pipe 209b may have a horizontal section, substantially parallel to the top surface 103 of the first housing 102, passing through the holes 210a in the metal sheets 210 in the fourth set. Each of the L-shaped heat-conductive pipes 209a and 209b may have a vertical section thermally connecting with the front side wall 107 between neighboring two of the metal sheets 109 by means of screwing, engaging, locking, joining or adhering connections. Each of the L-shaped heat-conductive pipes 209a and 209b may be a metal pipe, made of aluminum, an aluminum alloy, copper, a copper alloy, nickel, silver, steel, graphite, a thermally conductive metal or material, or a combination thereof, containing a fluid such as helium, argon, krypton, nitrogen, methane, ammonia, acetone, methanol, ethanol, heptane, or water. Alternative, each of the L-shaped heat-conductive pipes 209a and 209b may be replaced with L-shaped solid metal rod made of aluminum, an aluminum alloy, copper, a copper alloy, nickel, silver, steel, graphite, a thermally conductive metal or material, or a combination thereof, for example. Each of the L-shaped heat-conductive pipes 209a and 209b may have a diameter between 5 and 20 mm, such as between 5 mm and 9 mm or between 8 and 20 mm. Each of the holes 211a and 210a may have a diameter between 5 and 20 mm, such as between 5 mm and 9 mm or between 8 and 20 mm. In this embodiment, the heaters 204a and 204b, control circuit, temperature sensors and first and second sets of metal sheets 202 and 203 as illustrated in the first embodiment may be omitted.

Third Embodiment

Figure 5A:
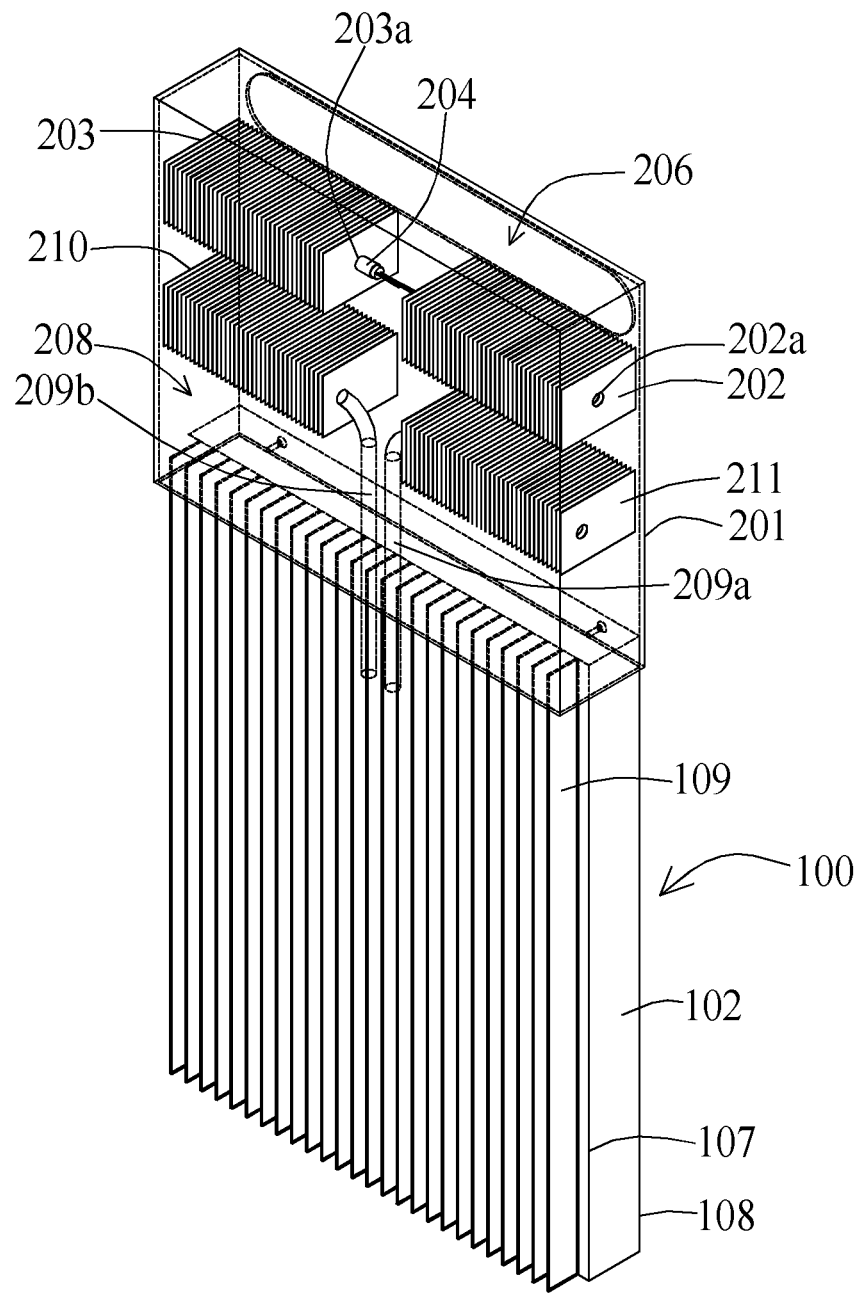
FIG. 5a is a perspective view illustrating an assembly for a radio remote unit and a heat exchanger in three dimensions in accordance with a first type of a three embodiment of the present invention.

In this embodiment, the characteristics as illustrated in the first embodiment may be combined with those as illustrated in the second embodiment. FIG. 5a is a perspective view illustrating an assembly for a radio remote unit and a heat exchanger in three dimensions in accordance with a first type of a three embodiment of the present invention. Referring to FIG. 5a, the first and second sets of metal sheets 202 and 203 may be arranged, in the gravity coordinate, over the third and fourth sets of metal sheets 211 and 210. In the gravity coordinate, an air gap may be vertically between the first set of metal sheets 202 and the third set of metal sheets 211, and an air gap may be vertically between the second set of metal sheets 203 and the fourth set of metal sheets 210 such that the first set of metal sheets 202 is in no contact with the third set of metal sheets 211 and the second set of metal sheets 203 is in no contact with the fourth set of metal sheets 210. The L-shaped heat-conductive pipes 209a and 209b may be provided to thermally connect the third set of metal sheets 211 to the first housing 102 and to thermally connect the fourth set of metal sheets 210 to the first housing 102 such that heat generated by the electronic device 100 may be immediately transmitted to the third and fourth set of metal sheets 211 and 210 through the first housing 102 and L-shaped heat-conductive pipes 209a and 209b and thus the third and fourth sets of metal sheets 211 and 210 may have increased temperature, as illustrated in the second embodiment.

Further, referring to FIG. 5a, the heater 204a may pass through the holes 202a in the metal sheets 202 in the first set, and the heater 204b may pass through the holes 203a in the metal sheets 203 in the second set. The specification of the heaters 204a and 204b may be referred to those as illustrated in the first embodiment. The one or more temperature sensors may be provided to sense one or more temperatures at one or various positions of the first housing 102, at a specific or critical position in the first housing 102 or at the combination thereof, as illustrated in the first embodiment. The specification of the one or more temperature sensors may be referred to those as illustrated in the first embodiment. The control circuit may be configured to control the heaters 204a and 204b to heat the first and second sets of metal sheets 202 and 203 respectively based on the temperature(s) sensed by the one or more temperature sensors, as illustrated in the first embodiment. The specification of the control circuit may be referred to those as illustrated in the first embodiment.

Figure 5B:
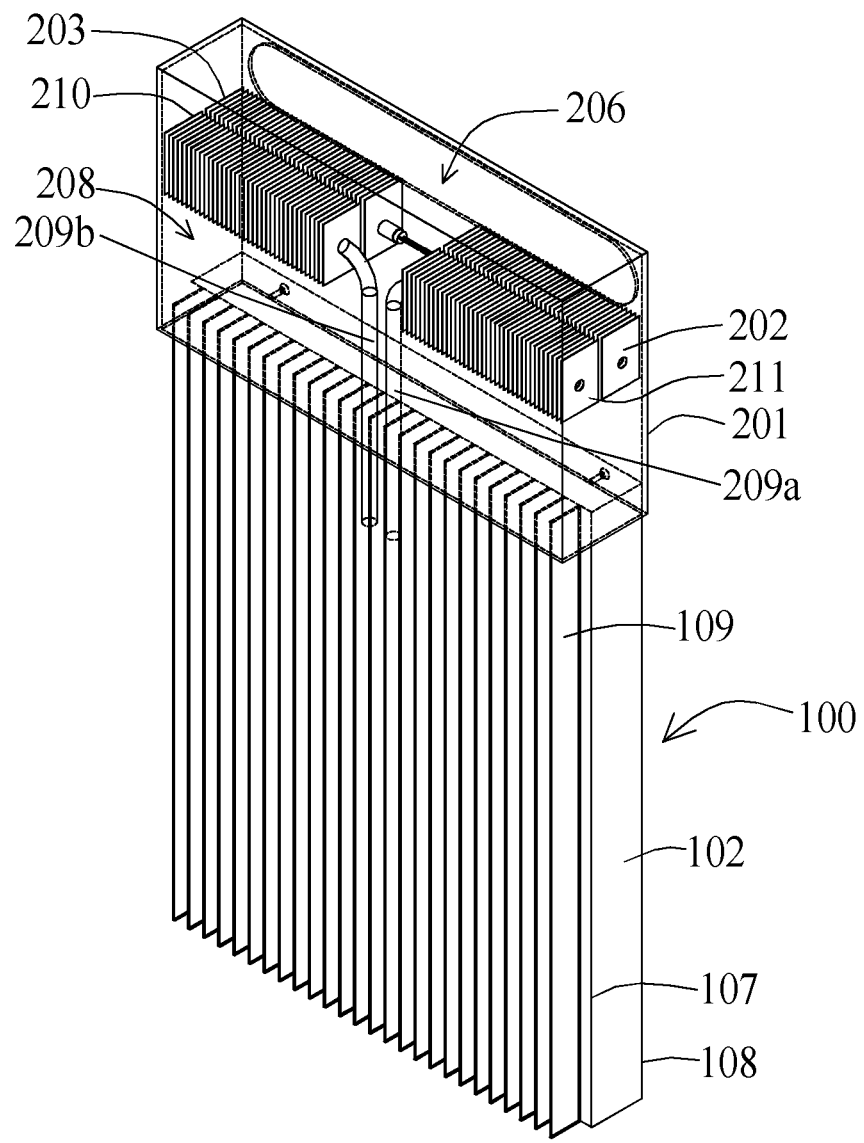
FIG. 5b is a perspective view illustrating an assembly for a radio remote unit and a heat exchanger in three dimensions in accordance with a second type of the three embodiment of the present invention.

Alternatively, FIG. 5b is a perspective view illustrating an assembly for a radio remote unit and a heat exchanger in three dimensions in accordance with a second type of the third embodiment of the present invention. Referring to FIG. 5b, the illustration for the second type of the third embodiment of the present invention may be referred to that for the first type of the third embodiment of the present invention, but the difference between the first and second types of the third embodiment is that the first and second sets of metal sheets 202 and 203 may be arranged, in the gravity coordinate, horizontally adjacent to the third and fourth sets of metal sheets 211 and 210, such as horizontally at a rear side of the third and fourth sets of metal sheets 211 and 210. In the gravity coordinate, an air gap may be horizontally between the first set of metal sheets 202 and the third set of metal sheets 211, and an air gap may be horizontally between the second set of metal sheets 203 and the fourth set of metal sheets 210 such that the first set of metal sheets 202 is in no contact with the third set of metal sheets 211 and the second set of metal sheets 203 is in no contact with the fourth set of metal sheets 210.

Accordingly, heat generated by the electronic device 100 may be immediately transmitted to the third set of metal sheets 211 through the first housing 102 and L-shaped heat-conductive pipe 209a and to the fourth set of metal sheets 210 through the first housing 102 and L-shaped heat-conductive pipe 209b, and thus the third and fourth sets of metal sheets 211 and 210 may have increased temperature. When the third and fourth sets of metal sheets 211 and 210 have increased temperature, the temperature within the inner space 208 in the second housing 201 may be increased to create an effect of buoyancy on heat transfer, that is, an air current may flow from the front side wall 107 of the first housing 102 upwards, in the gravity coordinate, into the inner space 208 in the second housing 201 and then to the outside of the second housing 201 through the opening 206. Thereby, an air current flowing through each gap between neighboring two of the metal sheets 109 may be increased to improve heat dissipation from the metal sheets 109. Upon determining one or more of the sensed temperature(s) is higher than a threshold temperature between 30 and 60 Celsius degrees, such as 40, 45 or 50 Celsius degrees, the control circuit may control the heaters 204a and 204b to heat the first and second sets of metal sheets 202 and 203 respectively such that the first and second sets of metal sheets 202 and 203 may have increased temperature. Each of the heaters 204a and 204b may have a temperature controlled to be greater than one or more of the sensed temperature by between 3 and 70 Celsius degrees, such as between 3 and 15 Celsius degrees, between 10 and 35 Celsius degrees or between 20 and 70 Celsius degrees. When the first and second sets of metal sheets 202 and 203 have increased temperature, the temperature within the inner space 208 in the second housing 201 may be further increased to create a better effect of buoyancy on heat transfer, that is, a more amount of air current may flow from the front side wall 107 of the first housing 102 upward, in the gravity coordinate, into the inner space 208 in the second housing 201 and then to the outside of the second housing 201 through the opening 206. Thereby, an air current flowing through each gap between neighboring two of the metal sheets 109 may be further increased to improve heat dissipation from the metal sheets 109.

Fourth Embodiment

Figure 6:
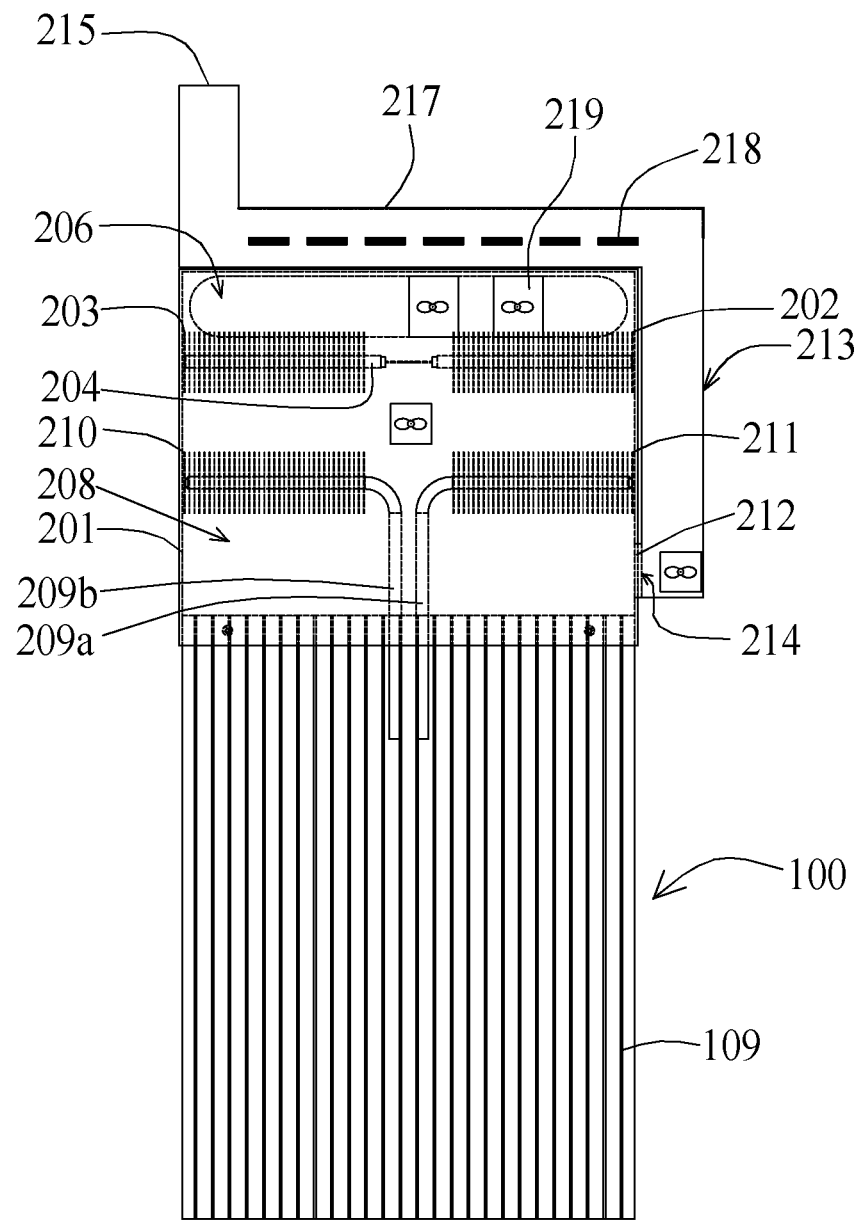
FIG. 6 is a front view illustrating an assembly for a radio remote unit and a heat exchanger in accordance with a fourth embodiment of the present invention.

The modification in accordance with the fourth embodiment may be applied to the above-mentioned first through third embodiments. The modification is that another opening 212 may be set at a lateral side wall of the second housing 201 and communicate with the inner space 208 in the second housing 201 and an air-current guide 213 is provided to couple with the opening 212 so as to communicate with the inner space 208 in the second housing 201 via the opening 212. In combination with the third embodiment shown in FIGS. 5a and 5b, the opening 212 may horizontally face the air gap vertically over the first housing 102 but under the first, second, third and fourth sets of metal sheets 202, 203, 211 and 210. The assembly shown in FIG. 6 is the modification deriving from that shown in FIG. 5a in the third embodiment. In combination with the second embodiment shown in FIGS. 3 and 4, the opening 212 may horizontally face the air gap vertically over the first housing 102 but under the third and fourth sets of metal sheets 211 and 210. In combination with the first embodiment shown in FIGS. 1 and 2, the opening 212 may horizontally face the air gap vertically over the first housing 102 but under the first and second sets of metal sheets 202 and 203.

With regards to the above combinations, the air-current guide 213, shaped like a pipe, may have a lower end mounted to the opening 212 and extend from the opening 212 upwards along the lateral side wall of the second housing 201, horizontally along a top side wall of the second housing 201 neighboring the lateral side wall of the second housing 201 and then vertically upwards in the gravity coordinate. An opening 214 at the lower end of the air-current guide 213 may be coupled with the opening 212 at the lateral side wall of the second housing 201 such that an inner space in the air-current guide 213 may communicate with the inner space 208 in the second housing 201 via the opening 214. An opening 215 at a top end of the air-current guide 213 may be arranged vertically over the top side wall of the second housing 201 and face upwards in the gravity coordinate. Thereby, an air current may flow from the inner space 208 in the second housing 201 to the inner space in the air-current guide 213 via the opening 214 and then from the inner space in the air-current guide 213 to the ambient via the opening 215. The air-current guide 213 may be a transparent pipe made of glass or acrylic. Multiple metal plates 218 may be arranged along and inside the air-current guide 213 and vertically over the top side wall of the second housing 201. The metal plates 218 may be arranged in a plane substantially parallel to the top surface of the top side wall of the second housing 201. The metal plates 218 may be coated with a heat absorbing layer, such as black layer made of carbon black. The air-current guide 213 may a vertically extending portion, shaped like a chimney, in the gravity coordinate with the opening 215 at the top end of the vertically extending portion of the air-current guide 213. The longer the vertically extending portion of the air-current guide 213, i.e. the higher the opening 215, the better the stack effect. The air current in the vertically extending portion of the air-current guide 213 may be drawn upwards along the vertically extending portion of the air-current guide 213 due to the stack effect so as to drive the air current in the air-current guide 213 to have a relatively high speed. Thereby, the heat dissipation from the electronic device 100 may be enhanced.

During the day time, the sun may pass through a transparent pipe 217 of the air-current guide 213 to illuminate the metal plates 218 to have an increased temperature. Thereby, in the air-current guide 213, the air ambient to the metal plates 218 may be caused to have an increased temperature so as to create an effect of buoyancy on heat transfer, that is, a hot air from the front side wall 107 of the first housing 102 or the inner space 208 in the second housing 201 may flow into the air-current guide 213 through the opening 214. Thereby, an air current flowing through each gap between neighboring two of the metal sheets 109 may be increased to improve heat dissipation from the metal sheets 109. During the night time, a hot air from the front side wall 107 of the first housing 102 may also flow to the outside through the air-current guide 213 through the opening 214 due to the stack effect. Thereby, the heat dissipation from the electronic device 100 may also be enhanced. The above-mentioned modification for the first through third embodiments may enhance the heat dissipation from the electronic device 100.

Alternatively, one or more fans 219 may be set in the inner space 208 in the second housing 201, at the opening 206 at the back side wall of the second housing 201 or at the opening 214 at the lower end of the air-current guide 213. The control circuit of the heat exchanger 200 may be electrically connected to the fans 219 to control the fans 219 based on the temperatures sensed by the temperature sensors. Upon determining one or more of the sensed temperature(s) is higher than a threshold temperature between 30 and 60 Celsius degrees, such as 40, 45 or 50 Celsius degrees, the control circuit may control the fans 219 to operate such that the air in the inner space 208 in the second housing 201 may be drawn out by the fans 219. Thereby, the heat dissipation from the electronic device 100 may be further enhanced.

Fifth Embodiment

Figure 7:
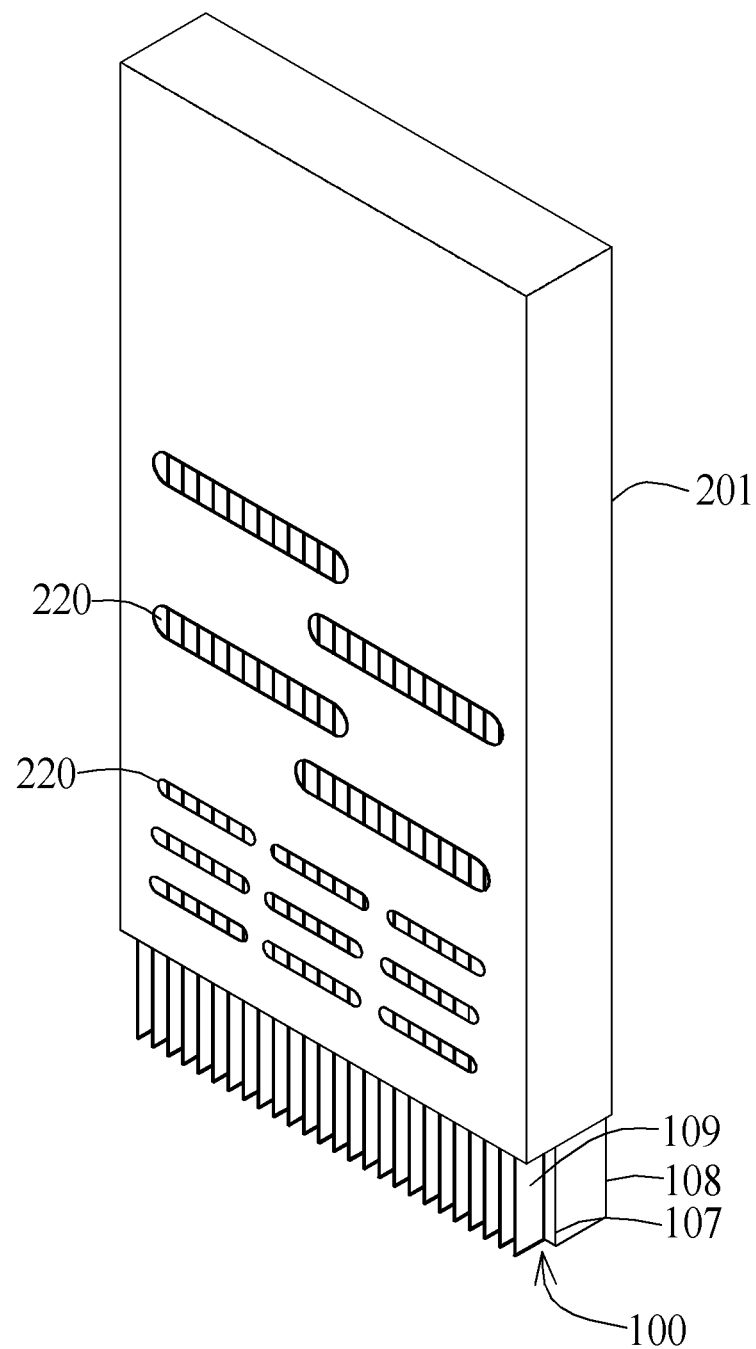
FIG. 7 is a three-dimensional view illustrating an assembly for a radio remote unit and a heat exchanger in accordance with a fifth embodiment of the present invention.

In the first through fourth embodiments, referring to FIGS. 1-6, the inner space 208 may be provided in the second housing 201 to accommodate a top portion of the electronic device 100, but the electronic device 100 has middle and bottom portions outside the inner space 208 in the second housing 201. For example, the second housing 201 may have a front side wall covering between 3% and 40% of the front side of the electronic device 100. Alternatively, the second housing 201 illustrated in the first through fourth embodiments may have a relatively long length in a longitudinal direction, in which the metal sheets 109 extend, as seen in FIG. 7. Thereby, a relatively large inner space 208 may be provided in the second housing 201 to accommodate a relatively large volume of the electronic device 100. The inner space 208 in the second housing 201 may accommodate the top and middle portions of the electronic device 100, but the electronic device 100 may have the bottom portion outside the inner space 208 in the second housing 201. The second housing 201 may have a front side wall with a relatively large area covering the front side of the electronic device 100. The front side wall of the second housing 201 may cover between 40% and 100% of the front side of the electronic device 100. For example, the front side wall of the second housing 201 may cover between 50% and 80% of the front side of the electronic device 100 or between 40% and 70% of the front side of the electronic device 100. Further, one or more openings 220, extending in a direction vertical to the direction in which the metal sheets 109 extend, may be arranged in the front side wall of the second housing 201 to expose the metal sheets 109 at the front side of the electronic device 100 and communicate with the opening 206 through the inner space 208 in the second housing 201. Some of the openings 220 may be arranged in an array, and some of the openings 220 may be arranged in random order. The openings 220 may have the same size or different sizes. Thereby, the air current may flow into the inner space 208 in the second housing 201 via the opening 205 or the openings 220 and flow out of the opening 206 and alternatively out of the opening 212 to the air-current guide 213 for the fourth embodiment. The efficiency of heat dissipation may be enhanced.

Sixth Embodiment

Figure 8A:
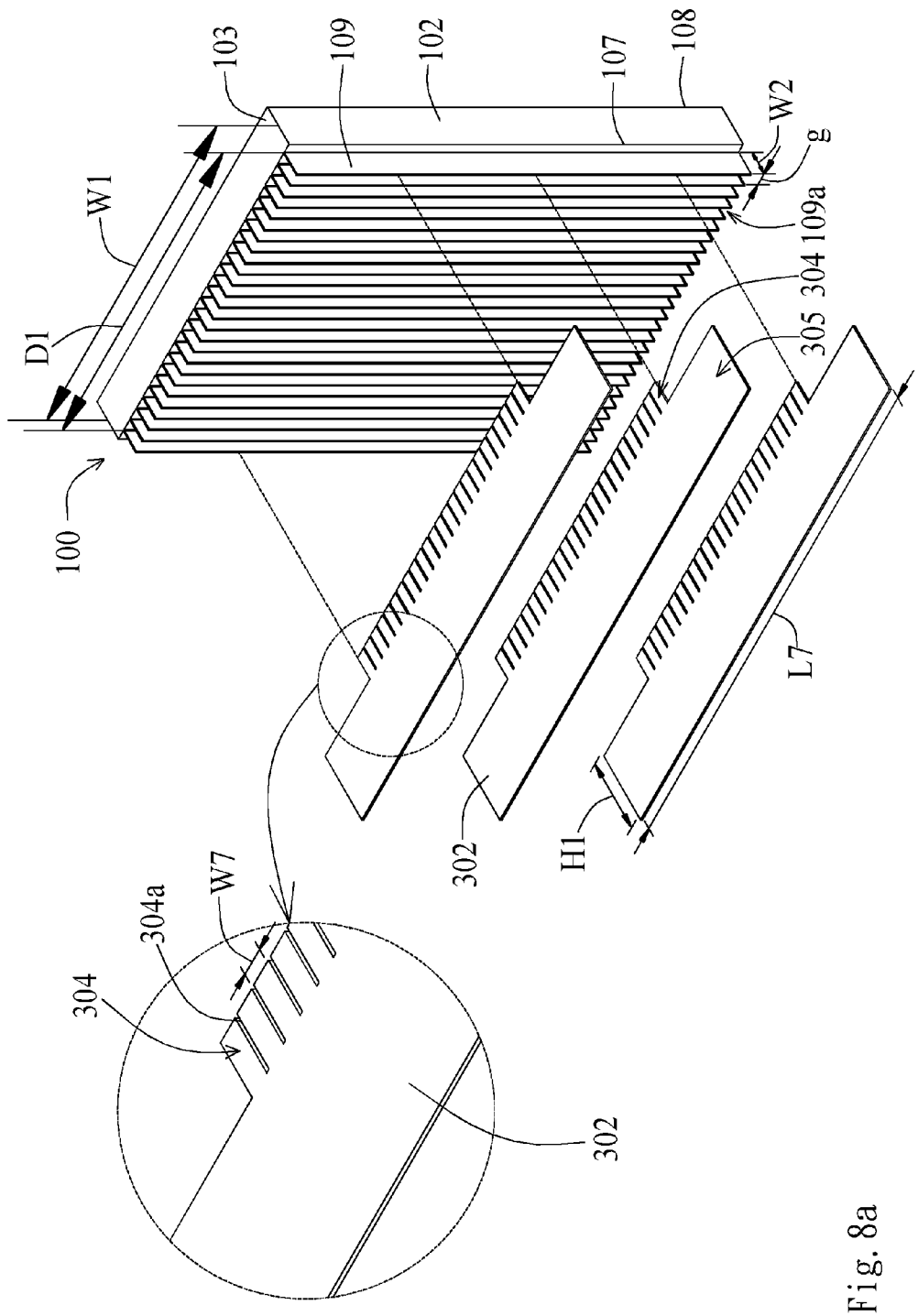
FIG. 8a is a three-dimensional view illustrating a radio remote unit provided with multiple current-guide plates in accordance with a sixth embodiment of the present invention.

FIG. 8a is a three-dimensional view illustrating a radio remote unit provided with multiple current-guide plates in accordance with a sixth embodiment of the present invention. FIG. 8b is a front view illustrating the radio remote unit provided with the current-guide plates in accordance with the sixth embodiment of the present invention. FIG. 8c is a side view illustrating multiple currents guided by the current-guide plates in accordance with the sixth embodiment of the present invention. Referring to FIGS. 8a and 8b, the electronic device 100 may be provided with one or more, such as three, current-guide plates 302 made of a metal, such as copper, aluminum or an alloy thereof, or polymer, such as plastic or rubber, and arranged in parallel, each having multiple insertion portions 304 each configured to be inserted into a gap 109a between neighboring two of the metal sheets 109 so as to completely separate a space in the gap 109a upper than said each of the insertion portions 304 from a space in the gap 109a lower than said each of the insertion portions 304. Each of the insertion portions 304 has a width W7 substantially equal to a distance g of each gap 109a, which is substantially vertical to neighboring two of the metal sheets 109.

Referring to FIGS. 8a and 8b, each of the current-guide plates 302 may have a longitudinal portion 305 spanning over all of the gaps 109a and all of the metal sheets 109. For each of the current-guide plates 302, the insertion portions 304 are integral with the longitudinal portion 305 as a single part and arranged side by side along a longitudinal side of the longitudinal portion 305. The longitudinal portion 305 of each current-guide plate 302 may have a longitudinal span or length L7 greater than a distance D1, between the leftmost and rightmost ones of the metal sheets 109, extending in a direction vertical to a direction in which the metal sheets 109 extend and greater than the width W1 of the first housing 102 such that the longitudinal portion 305 of each current-guide plate 302 may overhang a side of the first housing 102 and span beyond the leftmost and rightmost ones of the metal sheets 109 by a distance D2 more than one time, such as between 1.5 and 10 times, greater than the width W2 of metal sheets 109. The longitudinal portion 305 of each current-guide plate 302 may have a height H1 more than one time, such as between 1.5 and 5 times, greater than the width W2 of the metal sheets 109. Alternatively, the current-guide plates 302, metal sheets 109 and first housing 102 may be integrally formed as a single part.

Referring to FIG. 8c, the electronic device 100 may be arranged with the metal sheets 109 extending in a vertical direction in the gravity coordinate and the current-guide plates 302 extending horizontally at different horizontal levels respectively. Thereby, a first current 501 may vertically flow from a bottom side of the electronic device 100 to a bottom side of the bottom one of the current-guide plates 302 and then horizontally flow along the bottom side of the bottom one of the current-guide plates 302 to the outside such that heat transmitted to the metal sheets 109 and the front surface of the first housing 102 under the bottom one of the current-guide plates 302 can be immediately dissipated by the first current 501. A second current 502 may horizontally flow along a top side of the bottom one of the current-guide plates 302 to the metal sheets 109 and the front surface of the first housing 102, next vertically flow from the top side of the bottom one of the current-guide plates 302 to a bottom side of the middle one of the current-guide plates 302 and then horizontally flow along the bottom side of the middle one of the current-guide plates 302 to the outside such that heat transmitted to the metal sheets 109 and the front surface of the first housing 102 under the meddle one of the current-guide plates 302 and above the bottom one of the current-guide plates 302 can be immediately dissipated by the second current 502. A third current 503 may horizontally flow along a top side of the middle one of the current-guide plates 302 to the metal sheets 109 and the front surface of the first housing 102, next vertically flow from the top side of the middle one of the current-guide plates 302 to a bottom side of the top one of the current-guide plates 302 and then horizontally flow along the bottom side of the top one of the current-guide plates 302 to the outside such that heat transmitted to the metal sheets 109 and the front surface of the first housing 102 under the top one of the current-guide plates 302 and above the middle one of the current-guide plates 302 can be immediately dissipated by the third current 502. A fourth current 504 may horizontally flow along a top side of the top one of the current-guide plates 302 to the metal sheets 109 and the front surface of the first housing 102 and then vertically flow from the top side of the top one of the current-guide plates 302 to the outside such that heat transmitted to the metal sheets 109 and the front surface of the first housing 102 above the top one of the current-guide plates 302 can be immediately dissipated by the fourth current 504.

Seventh Embodiment

FIG. 9a is a front view illustrating the radio remote unit provided with a current-guide plate in accordance with a seventh embodiment of the present invention. FIG. 9b is an enlarged cross-sectional view along a line A-A' illustrating the current-guide plate assembled with the metal sheets in accordance with the seventh embodiment of the present invention. For the seventh embodiment, as seen in FIG. 9a, the difference from the sixth embodiment is that each of the current-guide plates 302 may be arranged in the gravity coordinate with one side, such as the left side of said each of the current-guide plates 302, lower than the other side thereof, such as the right side of said each of the current-guide plates 302; in this case, only one of the current-guide plates 302 is employed on the front surface of the first housing 102. The current-guide plates 302 in the sixth and seventh embodiments have similar structures. Also, referring to FIGS. 9a and 9b, the current-guide plate 302 in the seventh embodiment has multiple insertion portions 304 each configured to be inserted into one of the gaps 109a each between neighboring two of the metal sheets 109 so as to completely separate a space in said one of the gaps 109a upper than said each of its insertion portions from a space in said one of the gaps 109a lower than said each of its insertion portions. Each of its insertion portions 304 has one side, such as the left side of said each of its insertion portions 304, lower than the other side thereof, such as the right side of said each of its insertion portions 304.

Referring to FIGS. 9a and 9b, the current-guide plate 302 may have a longitudinal portion 305 spanning over all of the gaps 109a and all of the metal sheets 109. The insertion portions 304 are integral with the longitudinal portion 305 as a single part and arranged side by side along a longitudinal side of the longitudinal portion 305. The longitudinal portion 305 of the current-guide plate 302 may have a longitudinal span or length L7 greater than the distance D1, between the leftmost and rightmost ones of the metal sheets 109, extending in a direction with an angle a, such as between 30 and 90 degrees or between 30 and 75 degrees, from the metal sheets 109 and greater than the width W1 of the first housing 102 such that the longitudinal portion 305 of each current-guide plate 302 may overhang a side of the first housing 102 and span beyond the leftmost and rightmost ones of the metal sheets 109 by a distance D2 more than one time, such as between 1.5 and 10 times, greater than the width W2 of the metal sheets 109. The longitudinal portion 305 of the current-guide plate 302 may have a height H1 more than one time, such as between 1.5 and 5 times, greater than the width W2 of the metal sheets 109.

Referring to FIG. 9a, the electronic device 100 may be arranged with the metal sheets 109 extending in a vertical direction in the gravity coordinate and the current-guide plate 302 extending in a direction with the angle a from the metal sheets 109. Thereby, a first current 511 may vertically flow from a bottom side of the electronic device 100 to a bottom side of the current-guide plate 302 and then horizontally flow along the bottom side of the current-guide plate 302 to the outside such that heat transmitted to the metal sheets 109 and the front surface of the first housing 102 under the current-guide plate 302 can be immediately dissipated by the first current 511. A second current 512 may horizontally flow along a top side of the current-guide plate 302 and then to the metal sheets 109 and the front surface of the first housing 102 and then vertically flow from the top side of the current-guide plate 302 to the outside such that heat transmitted to the metal sheets 109 and the front surface of the first housing 102 above the current-guide plate 302 can be immediately dissipated by the second current 512.

Eighth Embodiment

Figure 10A:
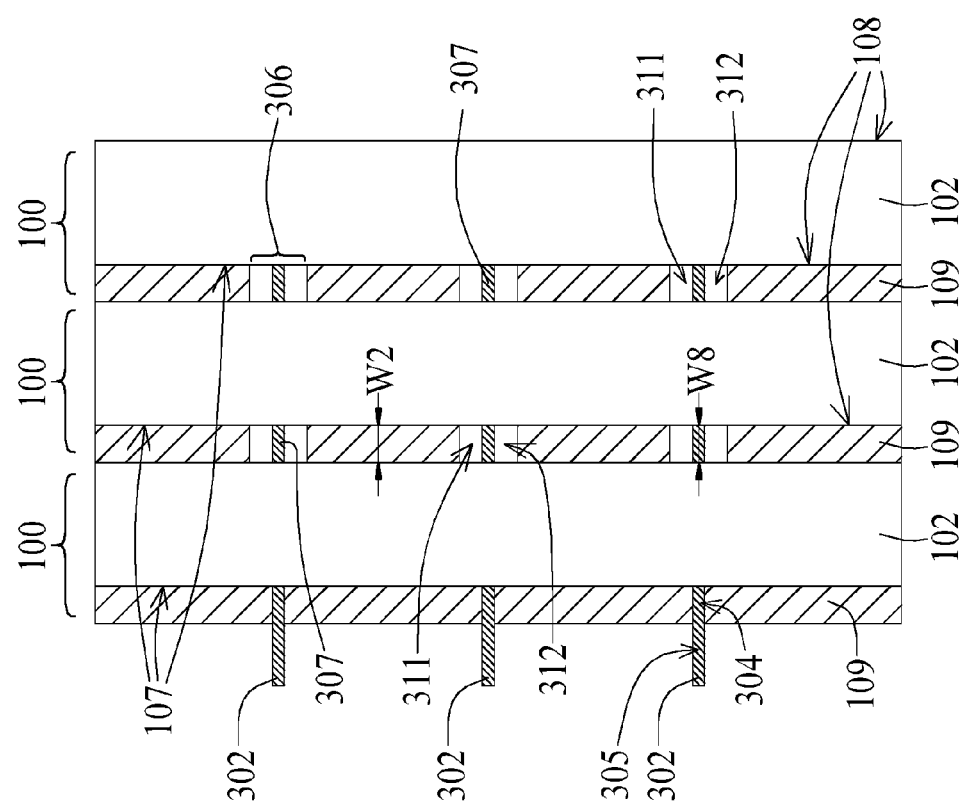
FIG. 10a is a side view illustrating multiple radio remote units stacked with one another and assembled with multiple current-guide plates in accordance with an eighth embodiment of the present invention.
Figure 10C:
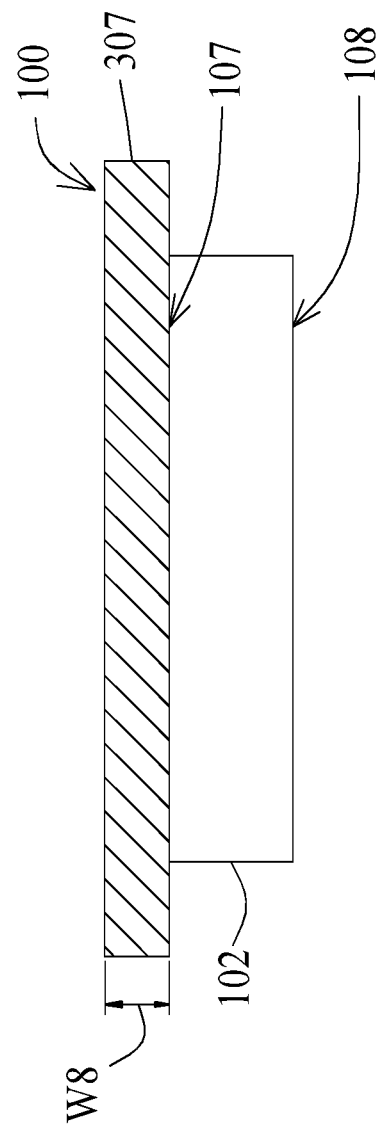
FIG. 10c is a cross-sectional view along a line B-B' illustrating one of the current-guide plates in accordance with the eighth embodiment of the present invention.

FIG. 10a is a side view illustrating multiple radio remote units stacked with one another and assembled with multiple current-guide plates in accordance with an eighth embodiment of the present invention. FIG. 10b is a front view illustrating one of the stacked radio remote units assembled with multiple current-guide plates in accordance with the eighth embodiment of the present invention. FIG. 10c is a cross-sectional view along a line B-B' illustrating one of the current-guide plates in accordance with the eighth embodiment of the present invention. Referring to FIG. 10a, multiple of the electronic devices 100 each having the first housing 102 with the same profile may be stacked with one another in a horizontal direction with respect to the gravity coordinate. In this case, three electronic devices 100 are stacked with one another. The middle one of the electronic devices 100 has the front surface 107 facing the back side wall 108 of the front one of the electronic devices 100. The rear one of the electronic devices 100 has the front surface 107 facing the back side wall 108 of the middle one of the electronic devices 100. One of the electronic devices 100 has four lateral side walls aligned respectively with four lateral side walls of the all others of the electronic devices 100. The front one of the electronic devices 100 may have the current-guide plates 302 arranged as illustrated in the sixth or seventh embodiment and the middle and rear ones of the electronic devices 100 may have the current-guide plates 307 arranged as seen in FIGS. 10b and 10c. Alternatively, the front one of the electronic devices 100 may have the current-guide plates 307 arranged as seen in FIGS. 10b and 10c.

Referring to FIGS. 10b and 10c, the difference between each of the middle and rear ones of the electronic devices 100 and the front one of the electronic devices 100 illustrated in the sixth or seventh embodiment is that one or more cuts 306 are formed in each of the metal sheets 109 illustrated in the sixth or seventh embodiment. Each of the middle and rear ones of the electronic devices 100 may have multiple current-guide plates 307 each accommodated in a set of the cuts 306 in the metal sheets 109 aligned in a horizontal direction so as to form an upper channel 311 extending along a top surface of said each of the current-guide plates 307 and a lower channel 312 extending along a bottom surface of said each of the current-guide plates 307. The upper channel 311 communicates with the gaps 109a each between neighboring two of the metal sheets 109 above said each of the current-guide plates 307. The lower channel 312 communicates with the gaps 109a each between neighboring two of the metal sheets 109 under said each of the current-guide plates 307. In this case, each of the middle and rear ones of the electronic devices 100 has three current-guide plates 307. The upper channel 311 extending along the top surface of the middle one of the current-guide plates 307 communicates with the lower channel 312 extending along the bottom surface of the top one of the current-guide plates 307 with the gaps 109a each between neighboring two of the metal sheets 109 between the top and middle ones of the current-guide plates 307. The upper channel 311 extending along the top surface of the bottom one of the current-guide plates 307 communicates with the lower channel 312 extending along the bottom surface of the middle one of the current-guide plates 307 with the gaps 109a each between neighboring two of the metal sheets 109 between the bottom and middle ones of the current-guide plates 307. The current-guide plates 307, metal sheets 109 and first housing 102 may be integrally formed as a single part.

Referring to FIGS. 10a and 10b, for the middle or rear one of the electronic devices 100, each of the current-guide plates 307 may have the same width W8 as the width W2 of the metal sheets 109. The front sides of the current-guide plates 307 and the front sides of the metal sheets 109 of the middle one of the electronic devices 100 may join the back side wall 108 of the front one of the electronic devices 100. The front sides of the current-guide plates 307 and the front sides of the metal sheets 109 of the rear one of the electronic devices 100 may join the back side wall 108 of the middle one of the electronic devices 100. For the middle or rear one of the electronic devices 100, its current-guide plates 307 may be arranged in parallel, extending in a direction vertical to a direction in which its metal sheets 109 extend and beyond its lateral side walls. For example, each of its current-guide plates 307 may overhang a side of the first housing 102 and span beyond the leftmost and rightmost ones of a set of the cuts 306 in the metal sheets 109 accommodating said each of its current-guide plates 307 by a distance D3 more than one time, such as between 1.5 and 10 times, greater than the width W2 of the metal sheets 109.

Referring to FIG. 10b, each of the middle and rear ones of the electronic devices 100 may be arranged with the metal sheets 109 extending in a vertical direction in the gravity coordinate and the current-guide plates 307 extending horizontally at different horizontal levels respectively. Thereby, for the middle or rear one of the electronic devices 100, a first current 521 may vertically flow from its bottom side to the lower channel 312 extending along the bottom surface of the bottom one of its current-guide plates 307 through the gaps 109a each between neighboring two of its metal sheets 109 under the bottom one of its current-guide plates 307 and then flow to the outside from two opposite exits of the lower channel 312 extending along the bottom surface of the bottom one of its current-guide plates 307 such that heat transmitted to the metal sheets 109, the front surface of its first housing 102 and the back side wall of the electronic device 100 in front thereof under the bottom one of its current-guide plates 307 can be immediately dissipated by the first current 521. A second current 522 may horizontally flow into the upper channel 311 extending along the top surface of the bottom one of its current-guide plates 307 from its two opposite intakes, next flow to the lower channel 312 extending along the bottom surface of the middle one of its current-guide plates 307 through the gaps 109a each between neighboring two of its metal sheets 109 between the bottom and middle ones of its current-guide plates 307 and then flow to the outside from two opposite exits of the lower channel 312 extending along the bottom surface of the middle one of its current-guide plates 307 such that heat transmitted to the metal sheets 109, the front surface of its first housing 102 and the back side wall of the electronic device 100 in front thereof between the bottom and middle ones of its current-guide plates 307 can be immediately dissipated by the second current 522. A third current 523 may horizontally flow into the upper channel 311 extending along the top surface of the middle one of its current-guide plates 307 from its two opposite intakes, next flow to the lower channel 312 extending along the bottom surface of the top one of its current-guide plates 307 through the gaps 109a each between neighboring two of its metal sheets 109 between the top and middle ones of its current-guide plates 307 and then flow to the outside from two opposite exits of the lower channel 312 extending along the bottom surface of the top one of its current-guide plates 307 such that heat transmitted to the metal sheets 109, the front surface of its first housing 102 and the back side wall of the electronic device 100 in front thereof between the top and middle ones of its current-guide plates 307 can be immediately dissipated by the third current 523. A fourth current 524 may horizontally flow into the upper channel 311 extending along the top surface of the top one of its current-guide plates 307 from its two opposite intakes and then vertically flow to the outside through the gaps 109a each between neighboring two of its metal sheets 109 above the top one of its current-guide plates 307 such that heat transmitted to the metal sheets 109, the front surface of its first housing 102 and the back side wall of the electronic device 100 in front thereof above the top one of its current-guide plates 307 can be immediately dissipated by the fourth current 524.

In this case, the exits at two ends of each of the lower channels 312 may have substantially the same width W9 as the width W10 of said each of the lower channels 312 in its center region. The intakes at two ends of each of the upper channels 311 may have substantially the same width W11 as the width W12 of said each of the upper channels 311 in its center region. Each of the intakes at two ends of each of the upper channels 311 may have substantially the same width W11 as the width W9 of each of the exits at two ends of each of the lower channels 312. The widths W9 and W10 of the lower channels 312 are greater than the distance g of the gap 109a between each neighboring two of the metal sheets 109. The widths W11 and W12 of the upper channels 311 are greater than the distance g of the gap 109a between each neighboring two of the metal sheets 109.

Ninth Embodiment

Figure 10D:
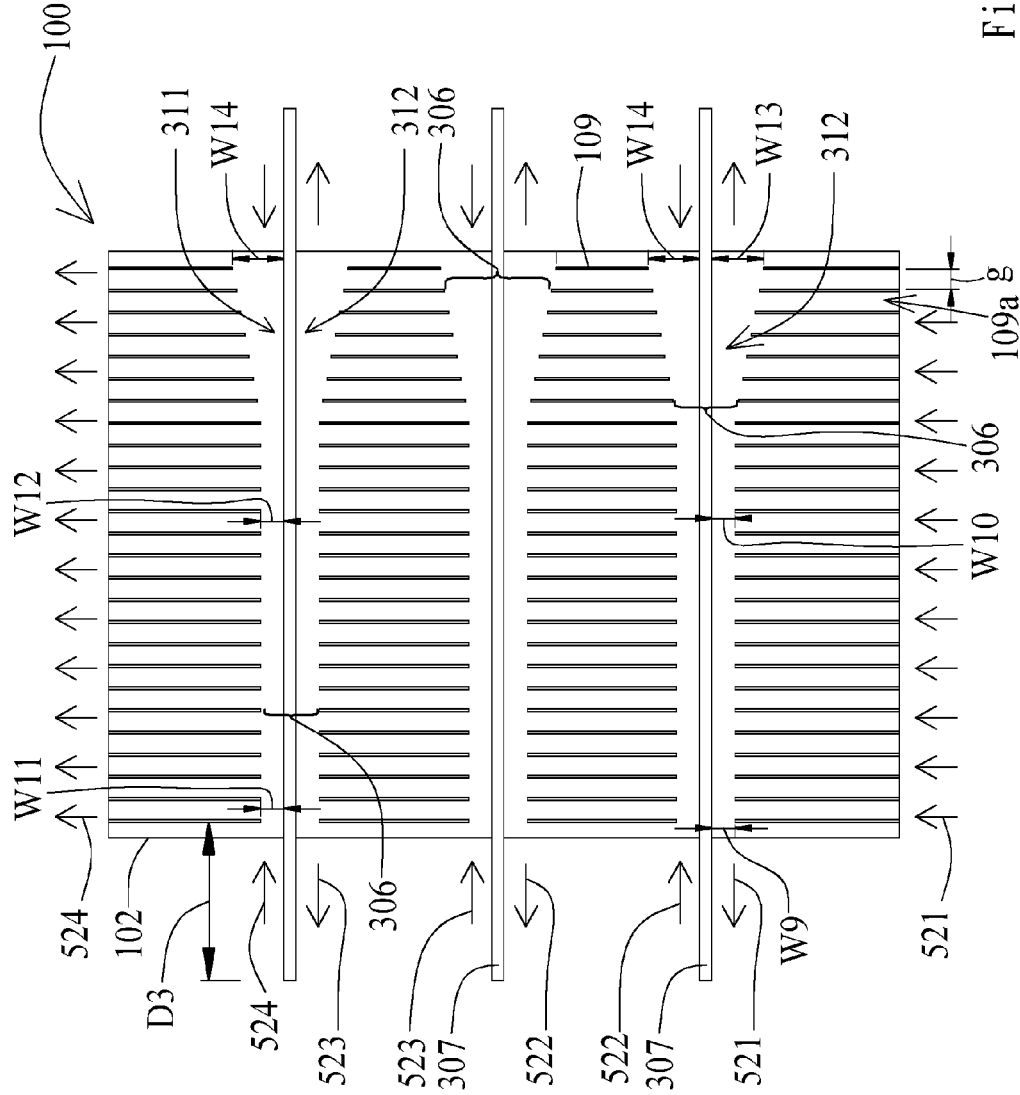
FIG. 10d is a front view illustrating one of the stacked radio remote units assembled with multiple current-guide plates in accordance with a ninth embodiment of the present invention.

FIG. 10d is a front view illustrating one of the stacked radio remote units assembled with multiple current-guide plates in accordance with a ninth embodiment of the present invention. The electronic device 100 illustrated in the ninth embodiment is similar to the middle and rear ones of the electronic devices 100 illustrated in the eighth embodiment. The difference from the middle and rear ones of the electronic devices 100 illustrated in the eighth embodiment is that the metal sheets 109 have different designs for forming multiple sets of the upper and lower channels 311 and 312 with gradually-increasing widths for one side of the electronic device 100. Referring to FIG. 10d, for the electronic device 100 illustrated in the ninth embodiment, the cuts 306 aligned in the same horizontal level may have widths gradually great from the inside of the front surface of its first housing 102 to one of the opposite edges, such as right edge, of the front surface of its first housing 102. Any one or both of the middle and rear ones of the electronic devices 100 illustrated in the eighth embodiment illustrated as seen in FIG. 10a may be replaced with the electronic device 100 illustrated in the ninth embodiment. Alternatively, the front one of the electronic devices 100 illustrated in the eighth embodiment as seen in FIG. 10a may be replaced with the electronic device 100 illustrated in the ninth embodiment.

In this case, the exit at the right end of each of the lower channels 312 may have a width W13 greater than the width W10 of said each of the lower channels 312 in its center region and than the width W9 of the exit at the left end of said each of the lower channels 312. The intake at the right end of each of the upper channels 311 may have a width W14 greater than the width W12 of said each of the upper channels 311 in its center region and than the width W11 of the intake at the left end of said each of the upper channels 311. The intake at the right end of each of the upper channels 311 may have substantially the same width W14 as the width W13 of the exit at the right end of each of the lower channels 312. The intake at the left end of each of the upper channels 311 may have substantially the same width W11 as the width W12 of said each of the upper channels 311 in its center region, as the width W9 of the exit at the left end of each of the lower channels 312 and as the width W10 of said each of the lower channels 312 in its center region. The widths W9, W10 and W13 of the lower channels 312 are greater than the distance g of the gap 109a between each neighboring two of the metal sheets 109. The widths W11, W12 and W14 of the upper channels 311 are greater than the distance g of the gap 109a between each neighboring two of the metal sheets 109.

Tenth Embodiment

FIG. 10e is a front view illustrating one of the stacked radio remote units assembled with multiple current-guide plates in accordance with a tenth embodiment of the present invention. The electronic device 100 illustrated in the tenth embodiment is similar to the middle and rear ones of the electronic devices 100 illustrated in the eighth embodiment and to the electronic device 100 illustrated in the ninth embodiment. The difference from the middle and rear ones of the electronic devices 100 illustrated in the eighth embodiment and the electronic device 100 illustrated in the ninth embodiment is that the metal sheets 109 have different designs for forming multiple sets of the upper and lower channels 311 and 312 with gradually-increasing widths for two opposite sides of the electronic device 100. Referring to FIG. 10e, for the electronic device 100 illustrated in the tenth embodiment, the cuts 306 aligned in the same horizontal level may have widths gradually great from the inside of the front surface of its first housing 102 to the opposite edges of the front surface of its first housing 102. Any one or both of the middle and rear ones of the electronic devices 100 illustrated in the eighth embodiment as seen in FIG. 10a may be replaced with the electronic device 100 illustrated in the ninth or tenth embodiment. Alternatively, the front one of the electronic devices 100 illustrated in the eighth embodiment as seen in FIG. 10a may be replaced with the electronic device 100 illustrated in the tenth embodiment.

In this case, the exits at the two opposite ends of each of the lower channels 312 may have a width W15 greater than the width W10 of said each of the lower channels 312 in its center region. The intakes at the two opposite ends of each of the upper channels 311 may have a width W16 greater than the width W12 of said each of the upper channels 311 in its center region. The intakes at the two opposite ends of each of the upper channels 311 may have substantially the same width W16 as the width W15 of the exit at the opposite ends of each of the lower channels 312. Each of the upper channels 311 in its center region may have the same width W12 as the width W10 of said each of the lower channels 312 in its center region. The widths W9, W10 and W15 of the lower channels 312 are greater than the distance g of the gap 109a between each neighboring two of the metal sheets 109. The widths W11, W12 and W16 of the upper channels 311 are greater than the distance g of the gap 109a between each neighboring two of the metal sheets 109.

Eleventh Embodiment

Figure 10F:
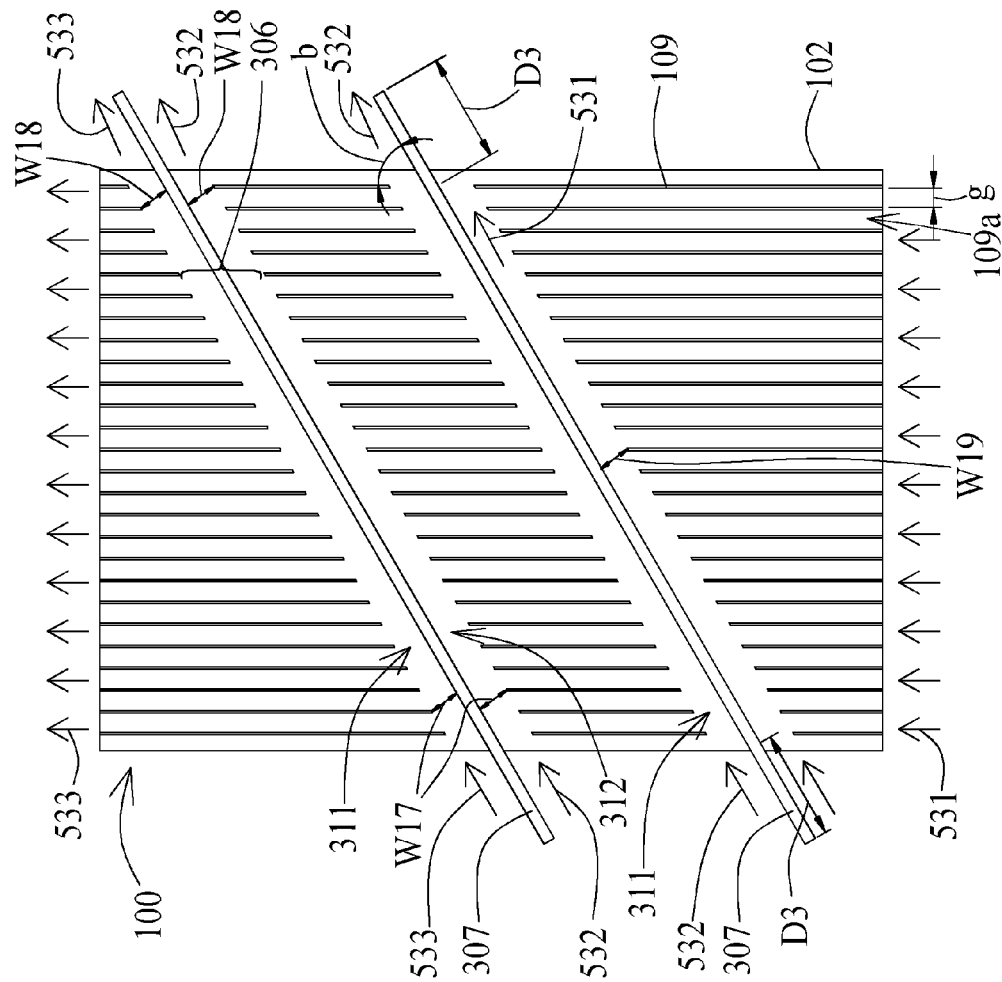
FIG. 10f is a front view illustrating one of the stacked radio remote units assembled with multiple current-guide plates in accordance with an eleventh embodiment of the present invention.

FIG. 10f is a front view illustrating one of the stacked radio remote units assembled with multiple current-guide plates in accordance with an eleventh embodiment of the present invention. The electronic device 100 illustrated in the eleventh embodiment is similar to the middle and rear ones of the electronic devices 100 illustrated in the eighth embodiment. Referring to FIG. 10f, the difference from the middle and rear ones of the electronic devices 100 illustrated in the eighth embodiment is that the metal sheets 109 have different designs for forming multiple sets of the upper and lower channels 311 and 312 each arranged in the gravity coordinate with an intake lower than an exit thereof. One or more, i.e. two in this case, sets of the cuts 306 aligned in parallel and in a direction with an angle b, such as between 30 and 90 degrees or between 30 and 75 degrees, from the metal sheets 109 are formed in the metal sheets 109. Each set of the cuts may accommodate one of current-guide plates 307 made of a metal, such as copper, aluminum or an alloy thereof, or polymer, such as plastic or rubber, so as to form the upper channel 311 extending along a top surface of said one of the current-guide plates 307 and the lower channel 312 extending along a bottom surface of said one of the current-guide plates 307. In this case, each of the upper and lower channels 311 and 312 may have an intake at a left side thereof lower than an exit thereof at a right side thereof. In this case, the intake of each of the upper and lower channels 311 and 312 has the same width W17 as the width W18 of the exit of any of the upper and lower channels 311 and 312 and the width W19 of any of the upper and lower channels 311 and 312 in its center region. The widths W17, W18 and 19 of the upper and lower channels 311 and 312 are greater than the distance g of the gap 109a between each neighboring two of the metal sheets 109.

Referring to FIG. 10f, the current-guide plates 307 may overhang a side of the first housing 102 and span beyond the leftmost and rightmost ones of a set of the cuts 306 in the metal sheets 109 accommodating said each of its current-guide plates 307 by the distance D3 more than one time, such as between 1.5 and 10 times, greater than the width W2 of the metal sheets 109 as seen in FIG. 10a. Any one or both of the middle and rear ones of the electronic devices 100 illustrated in the eighth embodiment as seen in FIG. 10a may be replaced with the electronic device 100 illustrated in the ninth, tenth or eleventh embodiment. Alternatively, the front one of the electronic devices 100 illustrated in the eighth embodiment as seen in FIG. 10a may be replaced with the electronic device 100 illustrated in the eleventh embodiment.

Referring to FIGS. 10a and 10f, the electronic device 100 may be arranged with the metal sheets 109 extending in a vertical direction in the gravity coordinate and the current-guide plates 307 extending in a direction with the angle b from the metal sheets 109. Thereby, a first current 531 may vertically flow from a bottom side of the electronic device 100 to the lower channel 312 extending along the bottom surface of the bottom one of the current-guide plates 307 through the gaps 109a each between neighboring two of its metal sheets 109 under the bottom one of the current-guide plates 307 and then flow to the outside from the right exit of the lower channel 312 extending along the bottom surface of the bottom one of the current-guide plates 307 such that heat transmitted to the metal sheets 109, the front surface of its first housing 102 and the back side wall of the electronic device 100 in front thereof under the bottom one of its current-guide plates 307 can be immediately dissipated by the first current 531. A second current 532 may flow into the upper channel 311 extending along the top surface of the bottom one of the current-guide plates 307 from its left intake and flow into the lower channel 312 extending along the bottom surface of the top one of the current-guide plates 307 from its left intake and then flow to the outside from the right exit of the upper channel 311 extending along the top surface of the bottom one of the current-guide plates 307 and the right exit of the lower channel 312 extending along the bottom surface of the top one of the current-guide plates 307 such that heat transmitted to the metal sheets 109, the front surface of its first housing 102 and the back side wall of the electronic device 100 in front thereof between the top and bottom ones of the current-guide plates 307 can be immediately dissipated by the second current 532. A third current 533 may flow into the upper channel 311 extending along the top surface of the top one of the current-guide plates 307 from its left intake and then flow to the outside through the gaps 109a each between neighboring two of the metal sheets 109 above the top one of the current-guide plates 307 such that heat transmitted to the metal sheets 109, the front surface of its first housing 102 and the back side wall of the electronic device 100 in front thereof above the top one of its current-guide plates 307 can be immediately dissipated by the third current 533.

Twelfth Embodiment

Figure 10G:
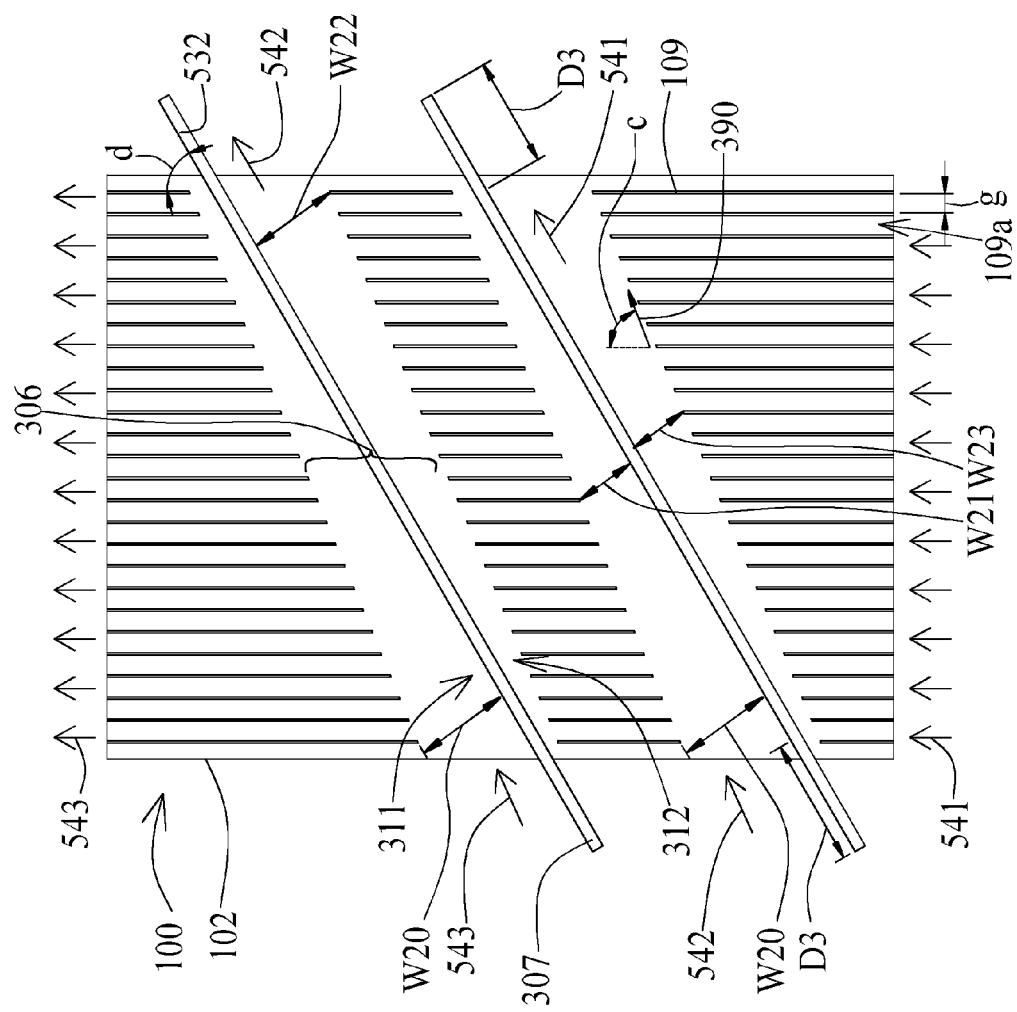
FIG. 10g is a front view illustrating one of the stacked radio remote units assembled with multiple current-guide plates in accordance with a twelfth embodiment of the present invention.

FIG. 10g is a front view illustrating one of the stacked radio remote units assembled with multiple current-guide plates in accordance with a twelfth embodiment of the present invention. The electronic device 100 illustrated in the twelfth embodiment is similar to the electronic device 100 illustrated in the eleventh embodiments. Referring to FIG. 10g, the difference from the electronic device 100 illustrated in the eleventh embodiment is that the metal sheets 109 have different designs for forming multiple sets of the upper and lower channels 311 and 312 each arranged in the gravity coordinate with an intake lower than an exit thereof. One or more, i.e. two in this case, sets of the cuts 306 aligned in parallel and in a direction 390 with an angle c, such as between 30 and 90 degrees or between 30 and 75 degrees, from the metal sheets 109 are formed in the metal sheets 109. Each set of the cuts may accommodate one of the current-guide plates 307 so as to form the upper channel 311 extending along a top surface of said one of the current-guide plates 307 and the lower channel 312 extending along a bottom surface of said one of the current-guide plates 307. Each of the current-guide plates 307 may extend in a direction with an angle d, such as between 30 and 90 degrees or between 30 and 75 degrees, from the metal sheets 109, wherein the angle d is smaller than the angle c. In this case, each of the upper channels 311 may have an intake at a left side thereof. Each of the lower channels 312 may have an exit at a right side thereof. Each of the upper channels 311 extending along the top surface of one of the current-guide plates 307 has widths gradually decreasing from the intake thereof to a right side thereof, that is, each of the upper channels 311 extending along the top surface of one of the current-guide plates 307 has the intake with a width W20 greater than a width W21 of said each of the upper channels 311 at its center region. Each of the lower channels 312 extending along the bottom surface of one of the current-guide plates 307 has widths gradually decreasing from the exit thereof to a left side thereof, that is, each of the lower channels 312 extending along the bottom surface of one of the current-guide plates 307 has the exit with a width W22 greater than a width W23 of said each of the lower channels 312 at its center region. The upper channel 311 extending along the top surface of a bottom one of the current-guide plates 307 has the intake arranged in the gravity coordinate lower than the exit of the lower channel 312 extending along the bottom surface of a top one of the current-guide plates 307. The widths W20 and W21 of the upper channels 311 are greater than the distance g of the gap 109a between each neighboring two of the metal sheets 109. The widths W22 and W23 of the lower channels 312 are greater than the distance g of the gap 109a between each neighboring two of the metal sheets 109.

Referring to FIG. 10g, each of the current-guide plates 307 may overhang a side of the first housing 102 and span beyond the leftmost and rightmost ones of a set of the cuts 306 in the metal sheets 109 accommodating said each of its current-guide plates 307 by the distance D3 more than one time, such as between 1.5 and 10 times, greater than the width W2 of the metal sheets 109 as seen in FIG. 10a. Any one or both of the middle and rear ones of the electronic devices 100 illustrated in the eighth embodiment as seen in FIG. 10a may be replaced with the electronic device 100 illustrated in the ninth, tenth, eleventh or twelfth embodiment. Alternatively, the front one of the electronic devices 100 illustrated in the eighth embodiment as seen in FIG. 10a may be replaced with the electronic device 100 illustrated in the twelfth embodiment.

Referring to FIGS. 10a and 10g, the electronic device 100 may be arranged with the metal sheets 109 extending in a vertical direction in the gravity coordinate and the current-guide plates 307 extending in a direction with the angle d from the metal sheets 109. Thereby, a first current 541 may vertically flow from a bottom side of the electronic device 100 to the lower channel 312 extending along the bottom surface of the bottom one of the current-guide plates 307 through the gaps 109a each between neighboring two of its metal sheets 109 under the bottom one of the current-guide plates 307 and then flow to the outside from the right exit of the lower channel 312 extending along the bottom surface of the bottom one of the current-guide plates 307 such that heat transmitted to the metal sheets 109, the front surface of its first housing 102 and the back side wall of the electronic device 100 in front thereof under the bottom one of its current-guide plates 307 can be immediately dissipated by the first current 541. A second current 542 may flow into the upper channel 311 extending along the top surface of the bottom one of the current-guide plates 307 from its left intake, flow to the lower channel 312 extending along the bottom surface of the top one of the current-guide plates 307 through the gaps 109a each between neighboring two of its metal sheets 109 between the bottom and top ones of the current-guide plates 307 and then flow to the outside from the right exit of the lower channel 312 extending along the bottom surface of the top one of the current-guide plates 307 such that heat transmitted to the metal sheets 109, the front surface of its first housing 102 and the back side wall of the electronic device 100 in front thereof between the top and bottom ones of the current-guide plates 307 can be immediately dissipated by the second current 542. A third current 543 may flow into the upper channel 311 extending along the top surface of the top one of the current-guide plates 307 from its left intake and then flow to the outside through the gaps 109a each between neighboring two of the metal sheets 109 above the top one of the current-guide plates 307 such that heat transmitted to the metal sheets 109, the front surface of its first housing 102 and the back side wall of the electronic device 100 in front thereof above the top one of its current-guide plates 307 can be immediately dissipated by the third current 543.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A heat exchanger configured to be arranged on a first housing of an electronic device, wherein said first housing has a top surface and a sidewall neighboring on said top surface of said first housing, wherein said first housing has multiple first metal sheets protruding from said sidewall of said first housing, comprising:
   a second housing configured to be mounted to said first housing, wherein a first opening is at a bottom of said second housing and configured to have said electronic device extend into an inner space in said second housing through said first opening, and a second opening is at a wall of said second housing and communicates with said inner space in said second housing;
   multiple second metal sheets in said inner space in said second housing, wherein said second metal sheets are configured to be arranged over said top surface of said first housing; and
   a first heat-conductive pipe in said inner space in said second housing, wherein said first heat-conductive pipe is thermally connected to said second metal sheets and configured to be thermally connected to said sidewall of said first housing; and
   multiple third metal sheets in said inner space in said second housing and a second heat-conductive pipe in said inner space in said second housing, wherein said second heat-conductive pipe is thermally connected to said third metal sheets and configured to be thermally connected to the sidewall of the first housing.

2. The heat exchanger of claim 1 further comprising multiple fourth metal sheets in said inner space in said second housing and a heater in said inner space in said second housing, wherein said heater is thermally connected to said fourth metal sheets.

3. The heat exchanger of claim 2, wherein said second metal sheets are configured to be arranged in parallel over said top surface of said first housing in no contact with said first housing, wherein said fourth metal sheets are configured to be arranged in parallel over said second metal sheets in no contact with said second metal sheets.

4. The heat exchanger of claim 1 further comprising a temperature sensor configured to be arranged on said sidewall of said first housing between neighboring two of said first metal sheets.

5. The heat exchanger of claim 1 further comprising a fluid in said first and second heat-conductive pipes.

6. The heat exchanger of claim 1, wherein said second metal sheets are configured to be arranged over said top surface of said first housing in the gravity coordinate.

7. The heat exchanger of claim 1, wherein a third opening is at said wall of said second housing and communicates with said inner space in said second housing.

8. The heat exchanger of claim 1 further comprising an air-current pipe having an end coupled to said second opening, wherein an inner space in said air-current pipe communicates with said inner space in said second housing, wherein said air-current pipe extends upward along said wall of said second housing to a top surface of said second housing neighboring said wall of said second housing, wherein a third opening at another end of said air-current pipe is over said top surface of said second housing.

9. An electronic device comprising:
   a first housing;
   multiple metal sheets protruding from a front surface of said first housing by a width of said metal sheets, wherein said metal sheets are arranged in parallel side by side, wherein said metal sheets and first housing are formed as a single part; and
   a first current-guided plate having a first insertion portion in a gap between two of said metal sheets and a first longitudinal portion joining said first insertion portion and extending across said metal sheets.

10. The electronic device of claim 9 further comprising a second current-guided plate having a second insertion portion in said gap and a second longitudinal portion joining said second insertion portion and extending across said metal sheets.

11. The electronic device of claim 9, wherein said first longitudinal portion spans beyond one of the most opposite sides of said metal sheets on said front surface of said first housing by a distance greater than said width of said metal sheets.

12. The electronic device of claim 9, wherein said first longitudinal portion overhangs a side of said first housing.

13. The electronic device of claim 9, wherein said first current-guided plate extends in a direction with an angle between 30 and 90 degrees from said metal sheets.

14. The electronic device of claim 9, wherein said first longitudinal portion extends in a height from said metal sheets greater than said width of said metal sheets.

15. An electronic device comprising:
   a first housing;
   multiple metal sheets protruding from a front surface of said first housing by a width of said metal sheets, wherein said metal sheets are arranged in parallel side by side, wherein multiple first cuts in said metal sheets are aligned in a direction; and
   a first current-guided plate extending on said front surface of said first housing and through said first cuts.

16. The electronic device of claim 15, wherein multiple second cuts in said metal sheets are aligned in said direction, further comprising a second current-guided plate extending on said first housing and through said second cuts.

17. The electronic device of claim 15, wherein said first current-guided plate spans beyond one of the most opposite sides of said metal sheets on said front surface of said first housing by a distance greater than said width of said metal sheets.

18. The electronic device of claim 15, wherein said first current-guided plate overhangs a side of said first housing.

19. The electronic device of claim 15, wherein said first current-guided plate extends in a direction with an angle between 30 and 90 degrees from said metal sheets.

20. The electronic device of claim 15, wherein said first current-guided plate extends in a width from said front surface of said first housing substantially equal to said width of said metal sheets.

* * * * *